United States Patent
Chang et al.

(10) Patent No.: US 8,966,411 B2
(45) Date of Patent: Feb. 24, 2015

(54) STANDARDIZED TOPOGRAPHICAL ARRANGEMENTS FOR TEMPLATE REGIONS THAT ORIENT SELF-ASSEMBLY

(71) Applicant: Massachusetts Institute of Technology, Cambridge, MA (US)

(72) Inventors: Jae-Byum Chang, Cambridge, MA (US); Hong Kyoon Choi, Cambridge, MA (US); Adam F. Hannon, Loganville, GA (US); Caroline A. Ross, Arlington, MA (US); Karl K. Berggren, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/899,936

(22) Filed: May 22, 2013

(65) Prior Publication Data
US 2013/0318483 A1    Nov. 28, 2013

Related U.S. Application Data

(60) Provisional application No. 61/650,027, filed on May 22, 2012, provisional application No. 61/653,008, filed on May 30, 2012.

(51) Int. Cl.
*G06F 17/50* (2006.01)
*B81C 1/00* (2006.01)
*B82Y 40/00* (2011.01)

(52) U.S. Cl.
CPC ............ *G06F 17/50* (2013.01); *B81C 1/00031* (2013.01); *B82Y 40/00* (2013.01)
USPC .............................................. 716/55; 716/50

(58) Field of Classification Search
CPC . G06F 17/50; G03F 7/70258; B81C 1/00031; B81C 2201/0149; B82Y 10/11; B82Y 40/00

USPC ...................................................... 716/50, 55
See application file for complete search history.

(56) References Cited

U.S. PATENT DOCUMENTS

2008/0194059 A1 * 8/2008 Wang et al. ................... 438/110
2012/0009390 A1 * 1/2012 Yang et al. ................... 428/179

OTHER PUBLICATIONS

Bita, Ion et al., "Graphoepitaxy of Self-Assembled Block Copolymers on Two-Dimensional Periodic Patterned Templates," Science, vol. 321, No. 5891, Aug. 15, 2008, pp. 939-943.
Yang, Joel K.W. et al., "Complex Self-Assembled Patterns Using Sparse Commensurate Templates with Locally Varying Motifs," Nature Nanotechnology, vol. 5, Apr. 2010, pp. 256-260.

(Continued)

*Primary Examiner* — Vuthe Siek
(74) *Attorney, Agent, or Firm* — Withrow & Terranova, P.L.L.C.

(57) ABSTRACT

This disclosure relates generally to systems and methods of providing standardized topographical configurations for template regions. In one embodiment, a set of array arrangements is selected. Arrays of template structures are then formed on at least one substrate. Each of the arrays is arranged in accordance with an array arrangement in the set of array arrangements such that the arrays correspond surjectively onto the set of array arrangements. After the arrays are formed, a self-assembly material is provided on the arrays. Self-assembly patterns formed by self-assembling material as a result of the arrays may be empirically observed and used to map a set of self-assembly pattern arrangements surjectively onto the set of array arrangements. Using this mapping, a combination of the self-assembly pattern arrangements that match a target pattern arrangement can be used to select a combination of array arrangements from the set of array arrangements for a template region.

18 Claims, 31 Drawing Sheets

(56) References Cited

OTHER PUBLICATIONS

Chang, Jae-Byum et al., "Aligned Sub-10-nm Block Copolymer Patterns Templated by Post Arrays," ACS Nano6, vol. 6, No. 3, Feb. 22, 2012, 21 pages.

Yang, Joel K.W. et al., "Using High-Contrast Salty Development of Hydrogen Silsesquioxane for Sub-10-nm Half-Pitch Lithography," Journal of Vacuum Science and Technology B: Microelectronics and Nanometer Structures, vol. 25, Issue 6, Nov./Dec. 2007, pp. 2025-2029.

* cited by examiner

STANDARDIZED TOPOGRAPHICAL ARRANGEMENTS FOR TEMPLATE REGIONS THAT ORIENT SELF-ASSEMBLY

RELATED APPLICATIONS

This application claims the benefit of provisional patent application Ser. No. 61/650,027, filed on May 22, 2012, and provisional patent application Ser. No. 61/653,008, filed on May 30, 2012, the disclosures of which are hereby incorporated herein by reference in their entireties.

FIELD OF THE DISCLOSURE

This disclosure relates generally to systems and methods for providing standardized topographical arrangements for template regions used to orient self-assembly of self-assembling materials.

BACKGROUND

Semiconductor manufacturing technology now requires the formation of nanoscale features on semiconductor substrates. Due to the ever-increasing levels of miniaturization, fabrication technologies are needed that are capable of forming intricate design patterns within ever-decreasing areas. There are various nanoscale fabrication technologies currently in use. For instance, one type of nanoscale fabrication technology is immersion optical and interference lithography. Unfortunately, it has become more and more difficult to focus light at sub-20-nanometer (nm) scales, and thus the resolution of immersion optical and interference lithography is limited. Scanning electron beam lithography is also used in nanoscale fabrication. However, scanning electron beam lithography does not have a high enough throughput to satisfy current industrial mass-production demands.

Self-assembling materials, such as block copolymers, are another promising candidate for nanoscale fabrication. These self-assembling materials are capable of self-assembly into nanoscale structures. To do this, topographical features are formed on a template region, which orients the self-assembly of the self-assembling materials in a desired manner. This thus alleviates the fabrication demands on other types of nanoscale fabrication technologies. In other words, these other types of fabrication technologies simply need to create the topographical features, and do not have to precisely form each of the intricate features of a nanoscale pattern. Instead, the topographical features are formed in the template region, which orients the self-assembly of the self-assembling materials, resulting in a desired nanoscale pattern. Unfortunately, these topographical configurations are determined ad hoc. Currently, determining the topographical configurations that result in desired nanoscale patterns is simply done by trial and error. This is a significant practical limitation, given that an almost unlimited number of nanoscale patterns will be required by semiconductor manufacturers. As such, more methodological techniques are needed to determine topographical configurations for self-assembly.

SUMMARY

This disclosure relates generally to systems and methods of providing standardized topographical configurations for template regions that orient self-assembly. The standardized topographical configurations can be utilized to design a template region on a substrate so that the template region results in a self-assembling material self-assembling to have a desired target pattern arrangement. In one embodiment, a set of array arrangements is selected. Arrays of template structures are then formed on at least one substrate. Each of the arrays is arranged in accordance with an array arrangement in the set of array arrangements, such that the arrays correspond surjectively onto the set of array arrangements. As such, every array arrangement in the set of array arrangements is represented at least once by the arrays. After the arrays are formed, self-assembly patterns are formed by self-assembling materials as a result of the arrays. The self-assembly patterns are then empirically observed. A set of self-assembly pattern arrangements may then be determined based on the self-assembly patterns empirically observed to have been formed by the self-assembling material as the result of the arrays. The set of self-assembly pattern arrangements is then mapped surjectively onto the set of array arrangements based on the self-assembly patterns empirically observed to have been formed by the self-assembling material as a result of the arrays. Accordingly, by using this mapping, a target self-assembly pattern can be constructed with the set of array arrangements, since a combination of the array arrangements in the set of array arrangements can be used to match the target self-assembly pattern. In other words, since it is known that self-assembly patterns arranged in accordance with the set of self-assembly pattern arrangements result from arrays arranged in accordance with the set of array arrangements, the set of array arrangements can be used to generate a template region representation that represents a template region with a combination of arrays that will result in the desired target self-assembly pattern when a self-assembling material self-assembles on the template region.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 5A-5D each illustrate array arrangements in the set of array arrangements selected as a result of the sub-procedures described with regard to FIGS. 4A-4H.

Figure 2:
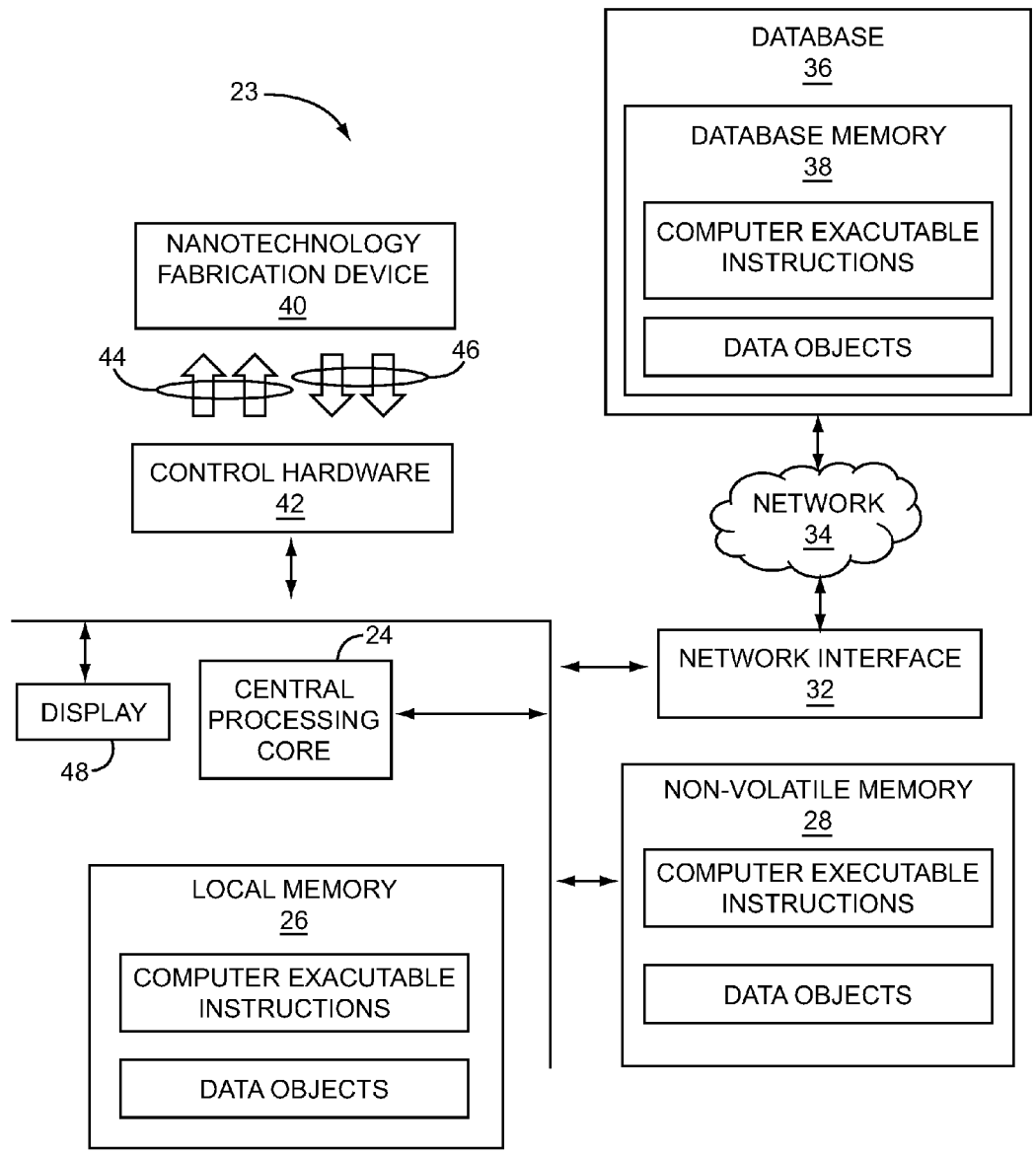
FIG. 2 illustrates one embodiment of a computer system having a central processing core that executes computer-executable instructions and a nanotechnology fabrication device configured to form template regions on substrates.
Figure 3:
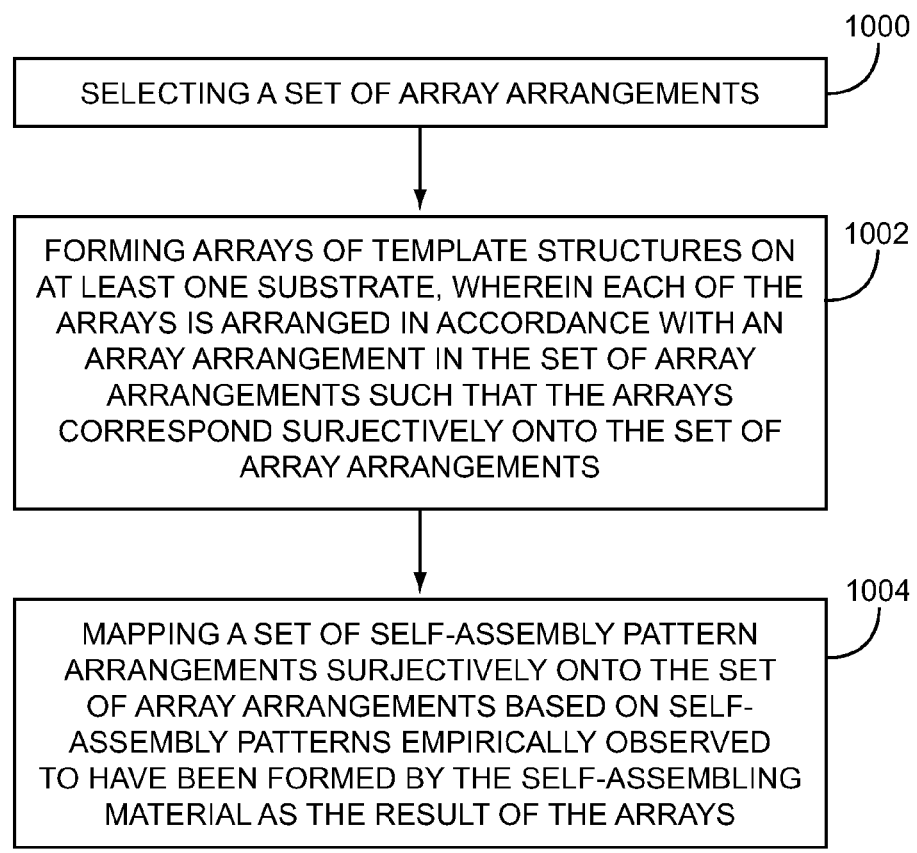
FIG. 3 illustrates one embodiment of procedures related to a method of providing standardized topographical configurations for template regions that orient self-assembly.

FIGS. 6A-6F are related to one embodiment of sub-procedures that may be performed by the computer system shown in FIG. 2 in order to form arrays of template structures on at least one substrate, wherein each of the arrays is arranged in accordance with an array arrangement in the set of array arrangements, as described by a second one of the procedures illustrated in FIG. 3.

Figure 7A:
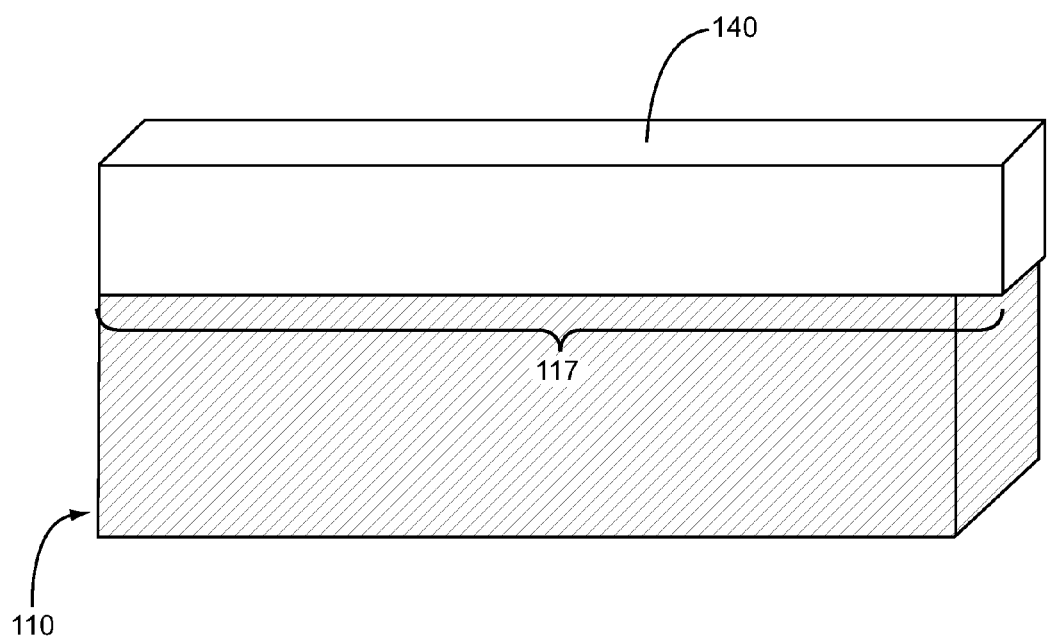
Figure 7B:
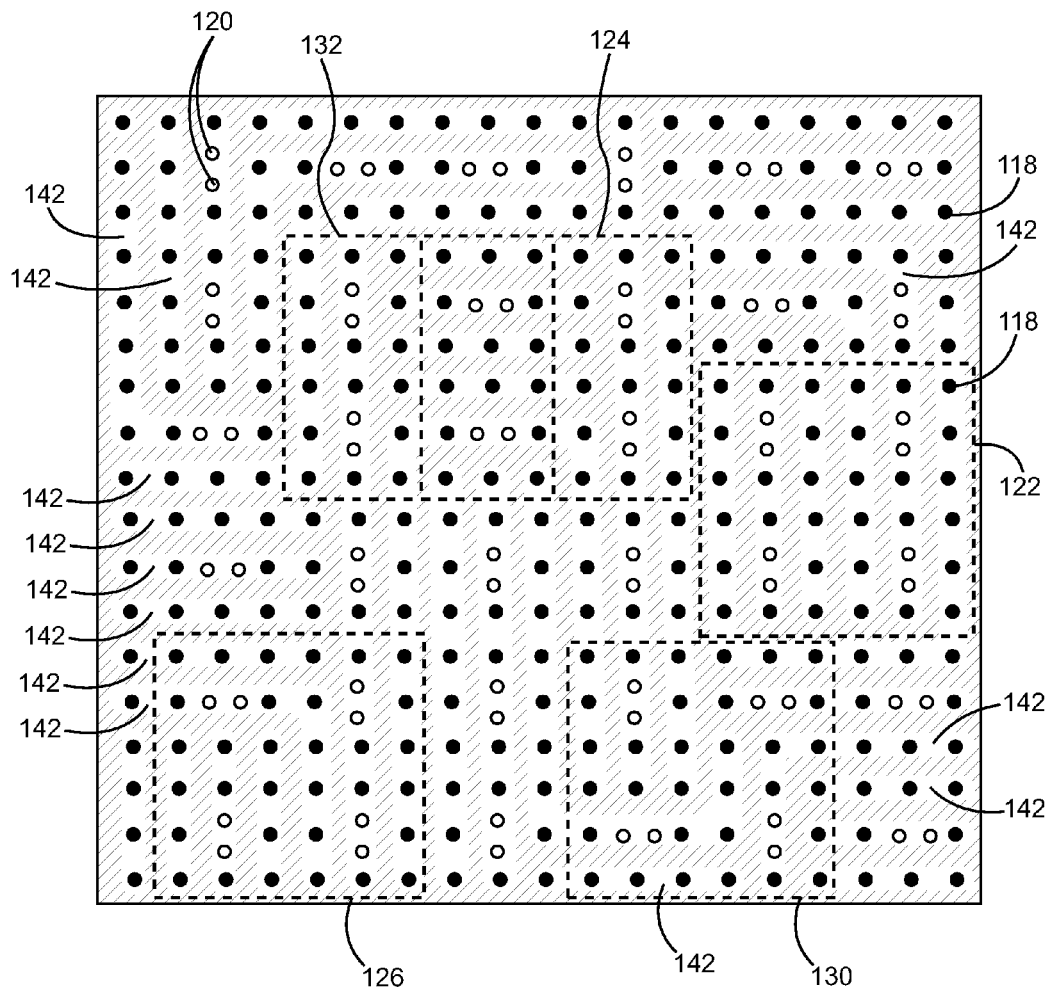
Figure 7C:
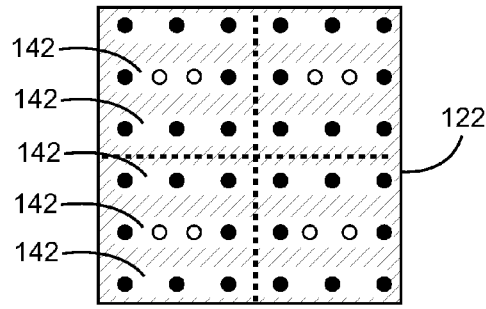
Figure 7D:
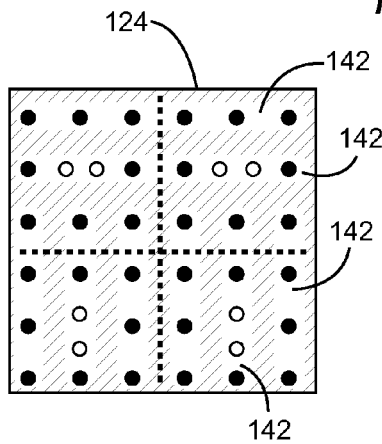
Figure 7E:
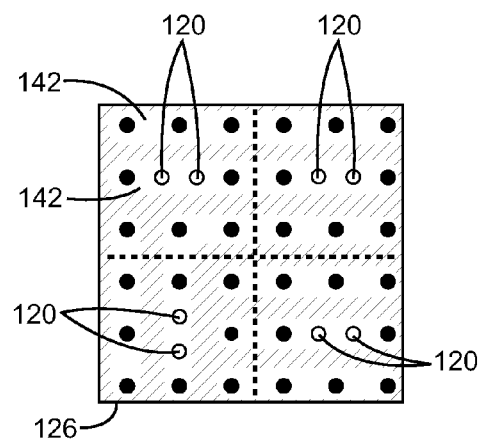
Figure 7F:
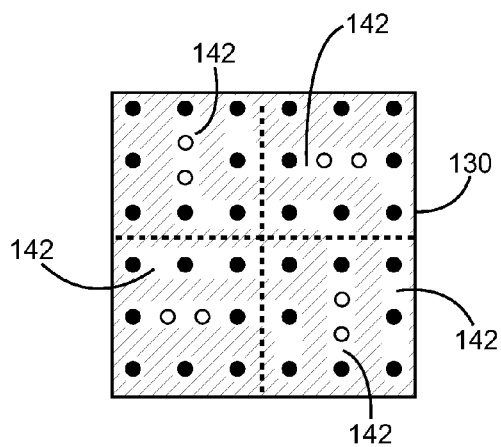
Figure 7G:
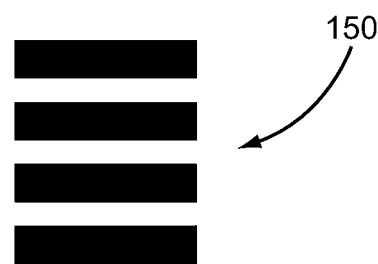
Figure 7H:
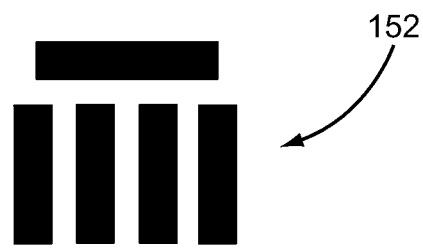
Figure 7I:
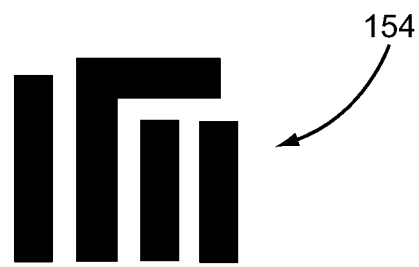
Figure 7J:
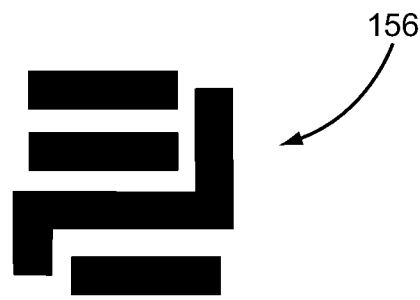
Figure 7K:
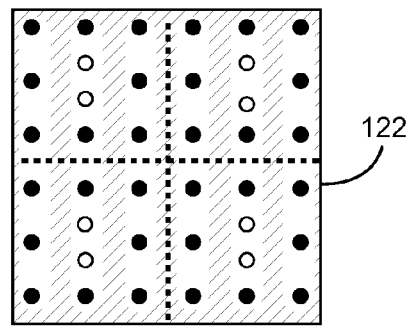
Figure 7L:
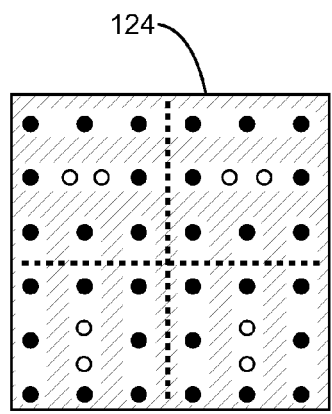
Figure 7M:
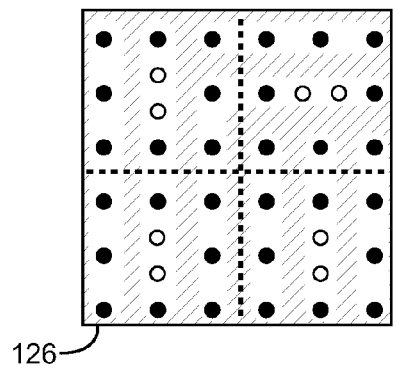
Figure 7N:
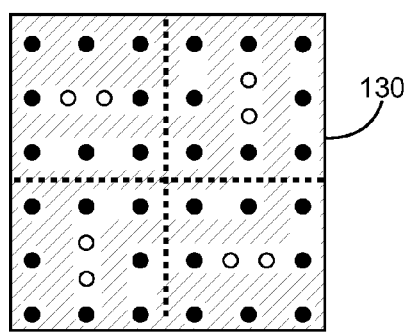
Figure 7O:
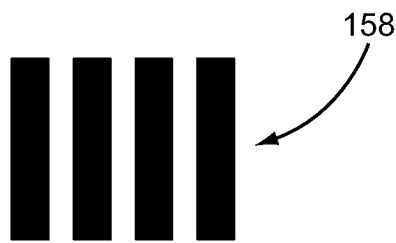
Figure 7P:
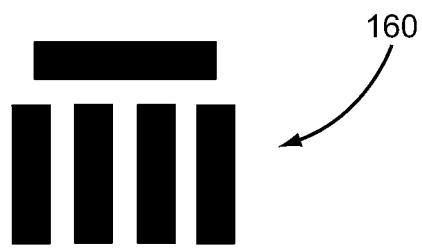
Figure 7Q:
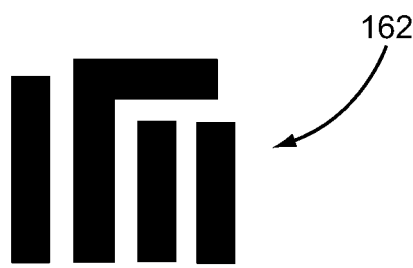
Figure 7R:
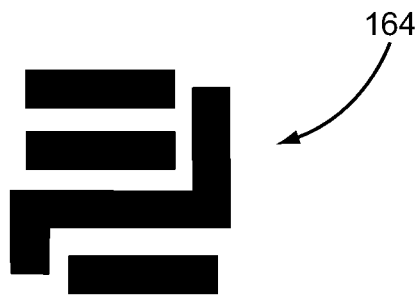
Figure 7S:
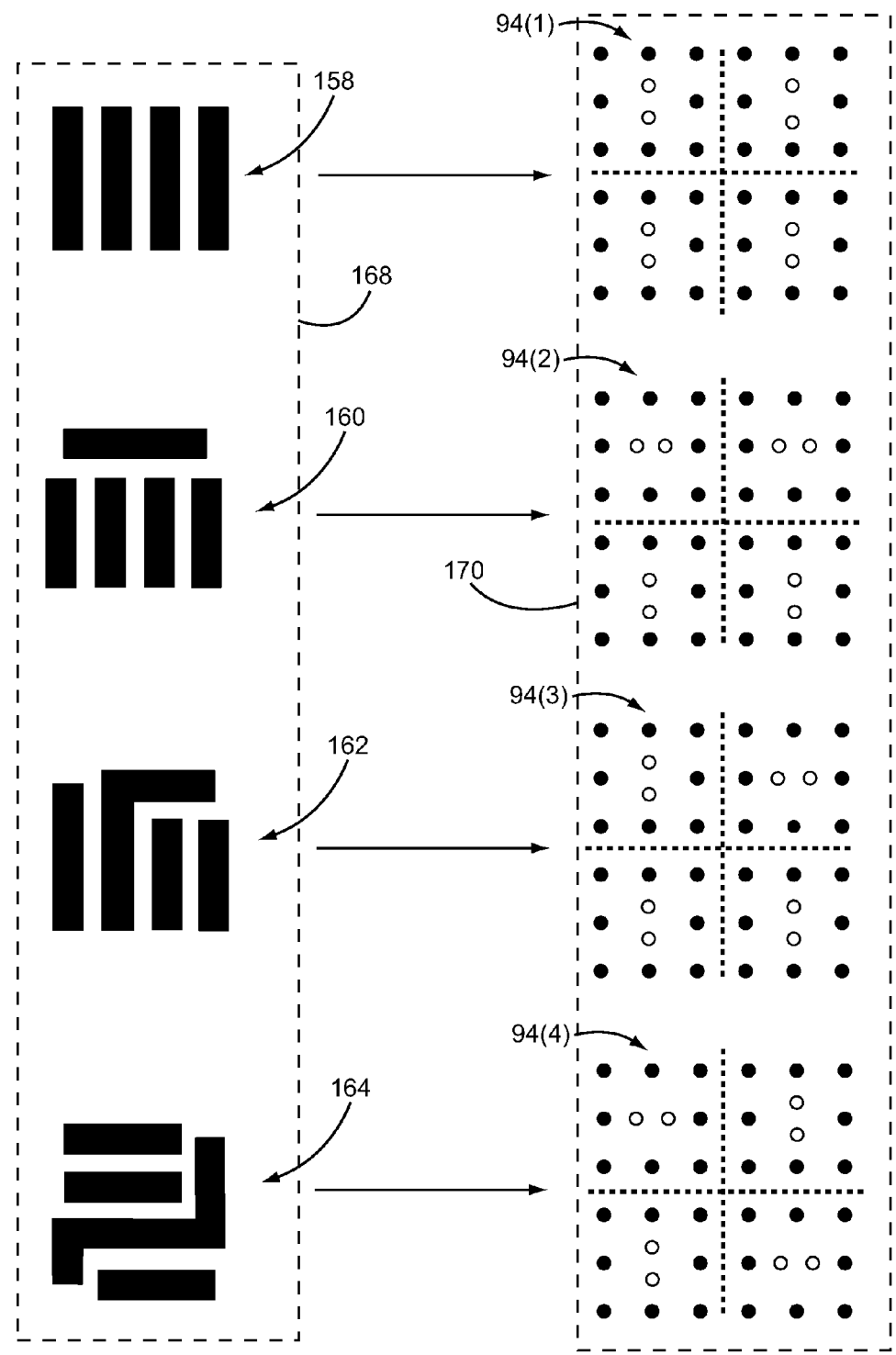

FIGS. 7A-7S are related to one embodiment of sub-procedures that may be performed by the computer system shown in FIG. 2 in order to map a set of self-assembly pattern arrangements surjectively onto a set of array arrangements based on the self-assembly patterns empirically observed to have been formed by the self-assembling material as a result of the arrays, in accordance with a third one of the procedures of the method illustrated in FIG. 3.

Figure 8:
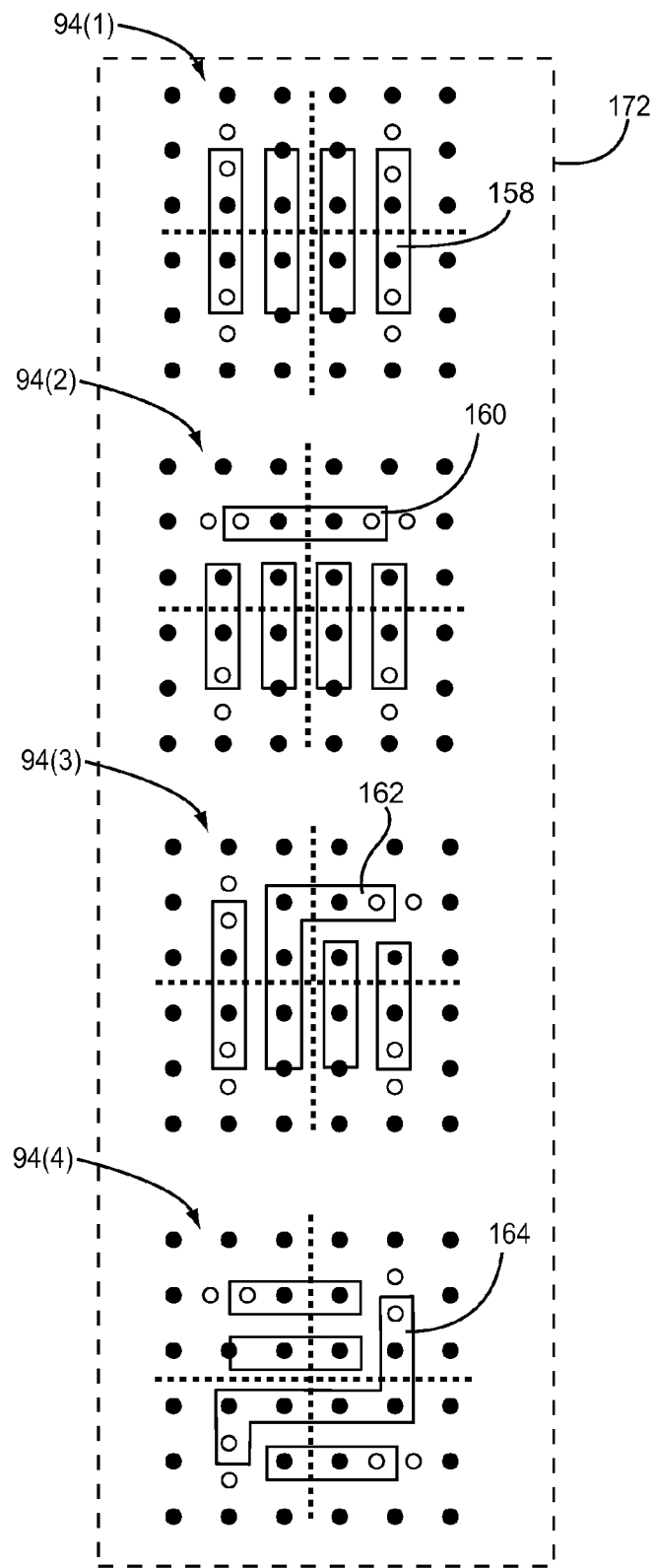

FIG. 8 is a visual representation of one embodiment of a mapping output generated as a result of the sub-procedures described with regard to FIGS. 7A-7S.

Figure 9:
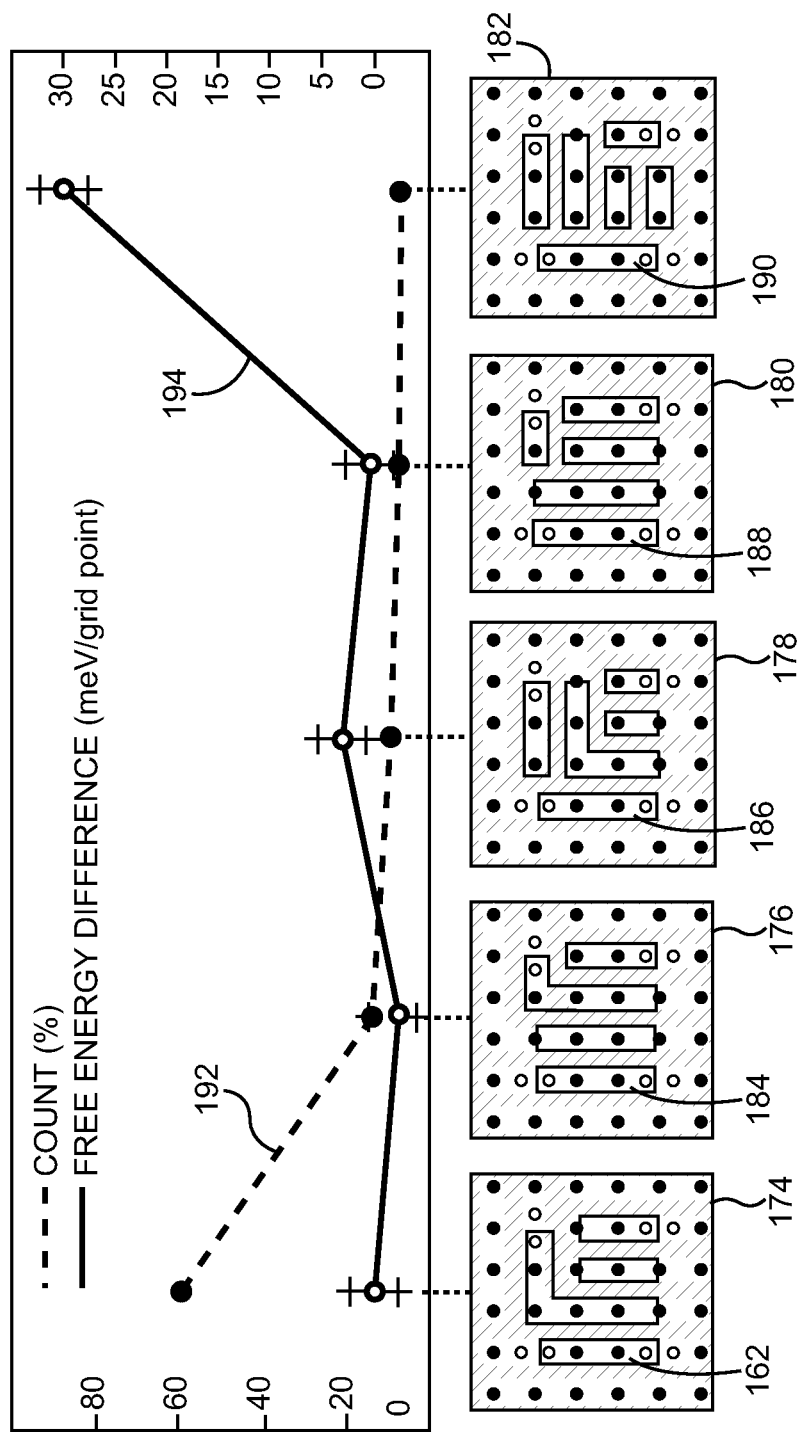

FIG. 9 illustrates several arrays arranged in accordance with the same array arrangement (illustrated in FIG. 5C), wherein, in this example, different self-assembly patterns result from the arrays.

Figure 10:
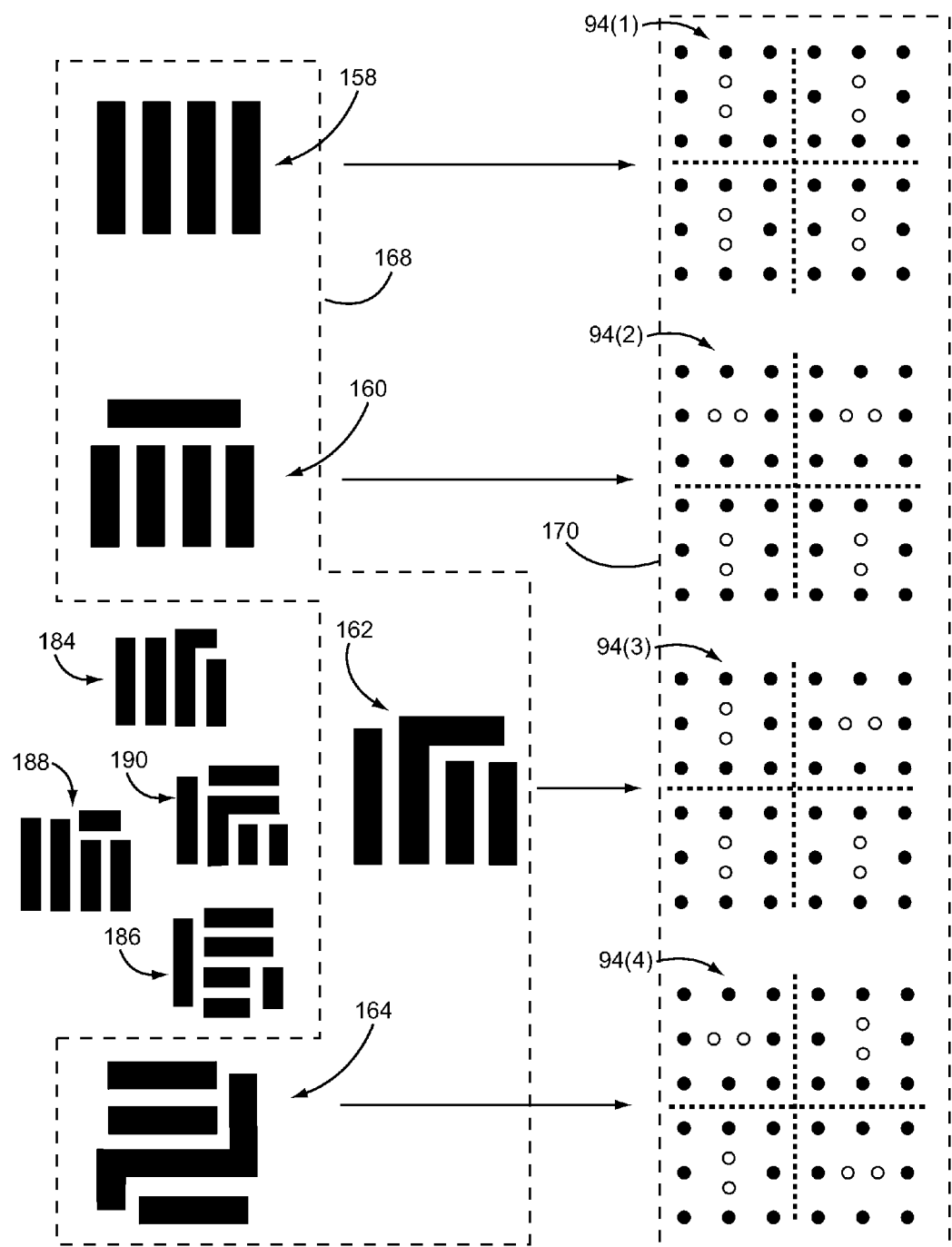

FIG. 10 visually illustrates one embodiment of a procedure for mapping a set of array arrangements surjectively onto a set of the array arrangements shown in FIGS. 5A-5D, given the different self-assembly patterns resulting from arrays arranged with the same array arrangement (illustrated in FIG. 5C) as illustrated in FIG. 9.

Figure 11:
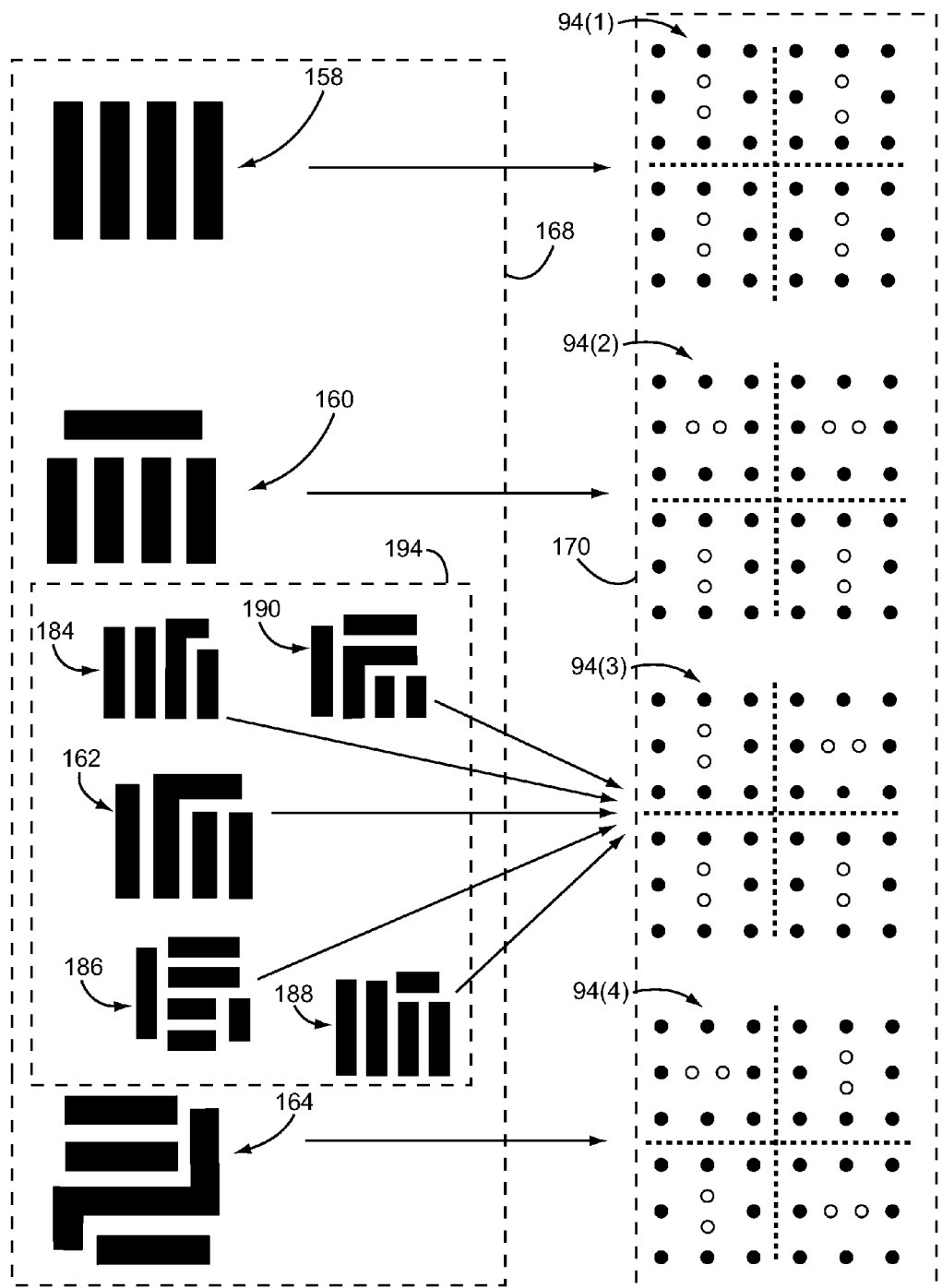

FIG. 11 visually illustrates another embodiment of a procedure for mapping a set of array arrangements surjectively onto a set of the array arrangements shown in FIGS. 5A-5D, given the different self-assembly patterns resulting from arrays arranged with the same array arrangement (illustrated in FIG. 5C) as illustrated in FIG. 9.

Figure 12:
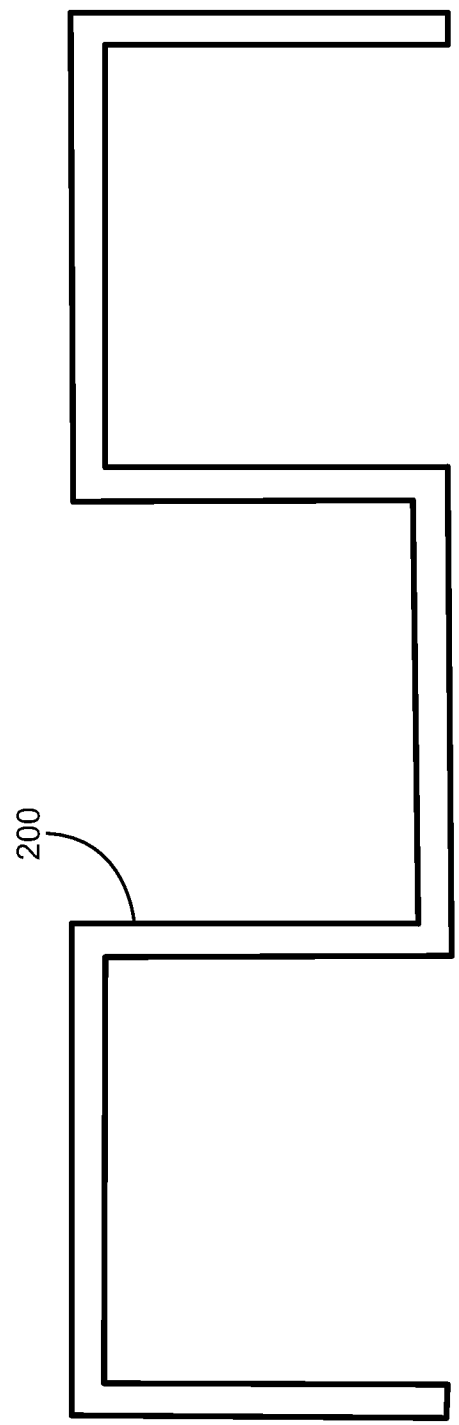

FIG. 12 illustrates one embodiment of a target pattern arrangement.

Figure 13:
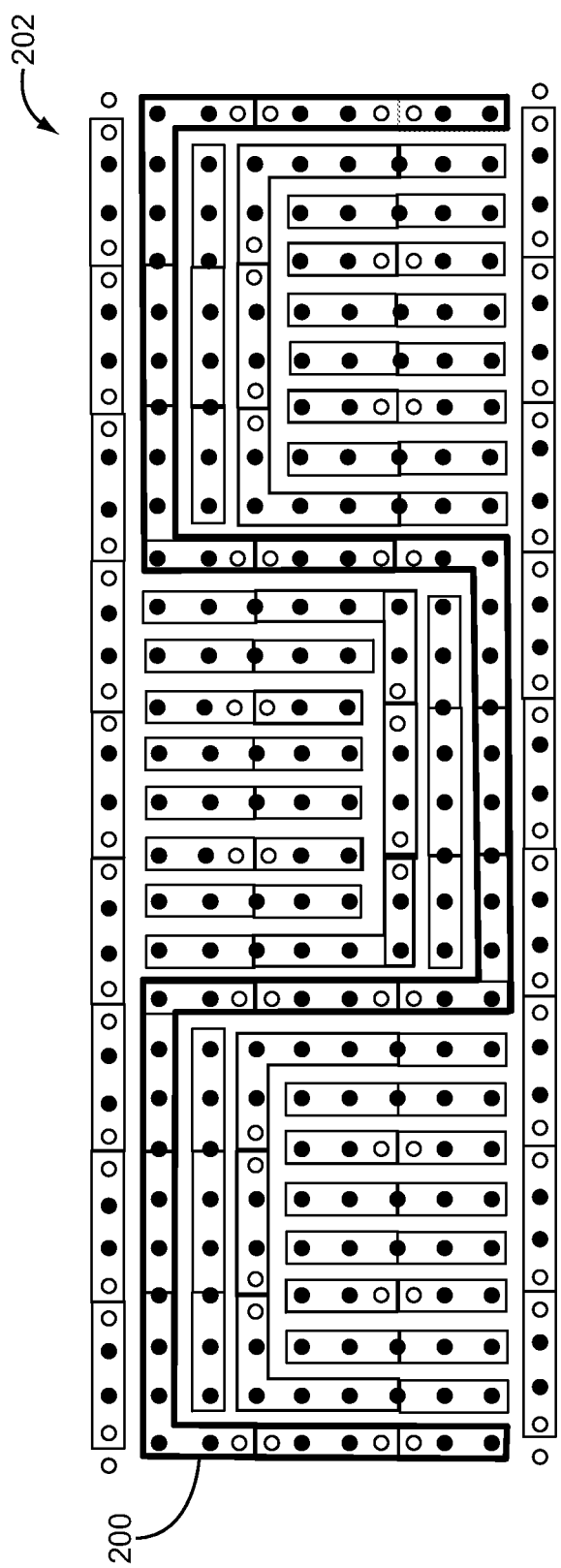

FIG. 13 visually illustrates one embodiment of a template region representation that represents a template region generated with the mapping output visually illustrated in FIG. 8, wherein the template region representation has been designed so that self-assembly of a self-assembling material matches the target pattern arrangement shown in FIG. 12.

Figure 14:
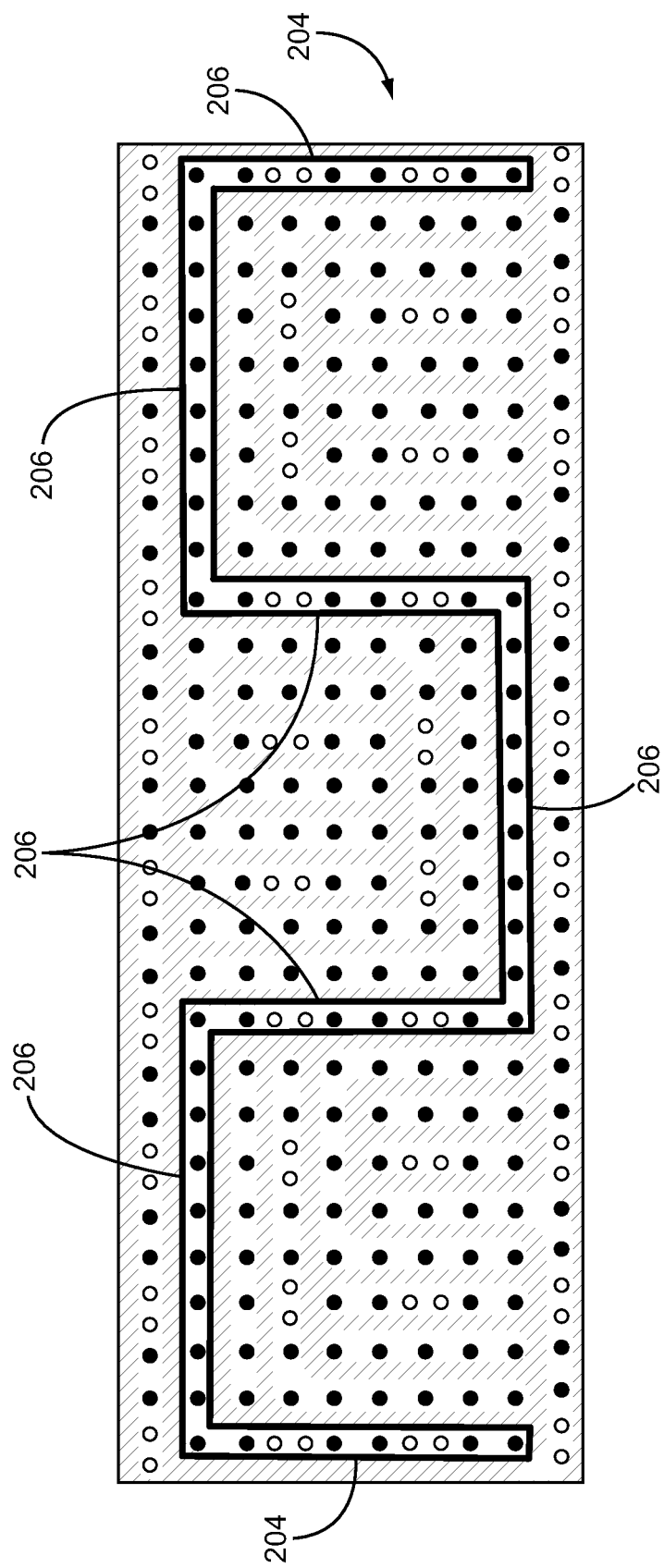

FIG. 14 illustrates one embodiment of a template region arranged in accordance with the template region representation visually illustrated in FIG. 13 after self-assembly of a self-assembling material on the template region where cylinders formed as a result of self-assembly are arranged in accordance with the target pattern arrangement shown in FIG. 12.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

A self-assembling material is a type of material that can self-assemble into an organized structure due to local interactions, such as the counterbalancing of internal molecular forces. For example, in self-assembling materials, intermolecular forces connect molecular building blocks in a reversible and controllable manner. Accordingly, these molecular building blocks have the ability to spontaneously assemble into complex structures. In other words, the self-assembling material is capable of self-organizing, and thus the material goes from a higher state of entropy to a lower state of entropy as a result of self-assembly. Often, the self-assembling of the self-assembling material is triggered by introducing thermal energy or through the release of chemical energy. The self-assembling material may then self-assemble into ordered aggregates until a thermal or a chemical equilibrium is reached. Some exemplary interactions that may be involved in the self-assembly of different types of self-assembling materials include solvophobic effects, dispersion forces, covalent bonds, hydrogen bonds, van der Waals forces, coordination interactions, and non-covalent bonds, such as electrostatic interaction.

The ability of self-assembling materials to self-assemble into ordered aggregates makes self-assembling materials particularly promising for use in nanotechnologies. Many self-assembling materials are also a type of nanomaterial (this term generally refers to those materials which form structures with at least one dimension less than about 100 nm). For instance, block copolymers are both self-assembling materials and nanomaterials. A block copolymer is a polymer having multiple sequences, or blocks, of a monomer, or alternating series of different monomer blocks. In most types of block copolymers, microphase separation has a prevalent effect in self-assembly. When polymer blocks (either two of the same type of blocks, or two or more different types of blocks) are forced to combine to form a copolymer, the blocks will try to separate from one another. However, a covalent bond between the blocks holds the blocks together. Upon annealing of the block copolymer, the blocks reorient themselves as far as possible from one another, while the covalent bond maintains the blocks together. These repelling interactions of the blocks in the block copolymer result in self-assembly of the block copolymer material into different types of in-plane shapes, such as lamellae, cylinders, spheres, gyroids, and/or the like. While the specific embodiments described in this disclosure refer to the block copolymer that self-assembles into in-plane cylinders, practitioners would recognize that the principles disclosed herein are further applicable to self-assembling materials that self-assemble into other morphologies. For instance, the principles described herein are applicable to self-assembling materials that self-assemble into other in-plane shapes, such as in-plane lamellae, in-plane spheres, in-plane gyroids, and/or the like, as well as standing shapes such as standing lamellae, standing spheres, standing cylinders, standing plane gyroids, and/or the like.

The embodiments specifically described herein relate to embodiments for diblock copolymers. Some examples of diblock copolymers include polystyrene (PS), polystyrene-b-polydimethylsiloxane (PS-b-PDMS), polystyrene-b-polymethylmethacrylate (PS-b-PMMA), and polystyrene-b-isoprene (PS-b-PI). However, it should be noted that the described techniques may have applications with regard to other types of self-assembling materials, such as organic materials (for example, DNA and RNA), other types of self-replicating organic compounds, self-organizing crystalline structures (such as metallic materials or semiconductor materials), and any other type of suitable self-assembling material capable of being used to form mesoscopic and/or nanoscale self-assembly structures.

While self-assembling materials can be naturally annealed to form mesoscopic and nanoscale structures, the orientation of these template structures is guided to control the orientation of the structure. One technique for guiding the orientation of a self-assembling material is to utilize a template region on a substrate. The template region has template structures that are functionalized so as to create the forces that control self-assembly.

Figure 1A:
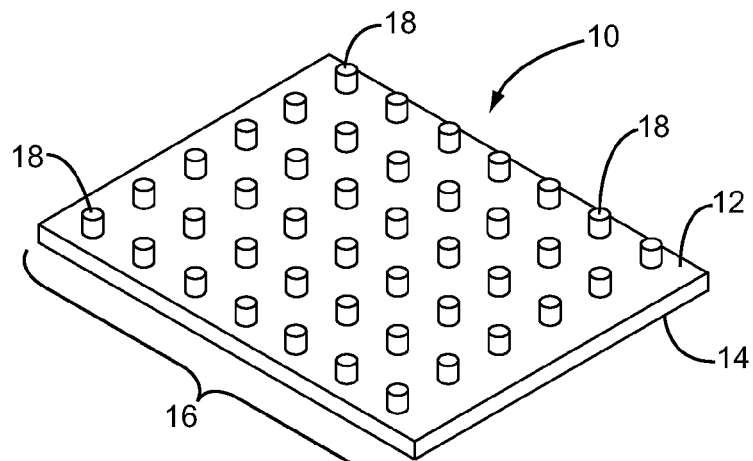
FIG. 1A illustrates one embodiment of a substrate with a template region.

FIG. 1A illustrates one embodiment of a template region 10 formed on a surface 12 of a substrate 14. The template region 10 includes the surface 12 and a templated array 16. The templated array 16 is an array of template structures 18 formed on the surface 12. The template structures 18 each extend transversely from the surface 12, and in general are normal to the surface 12. In this embodiment, the templated array 16 includes only one type of template structure 18, which in this case is a single dot post template structure. A "dot" is a post template structure having a cylindrical shape. With regard to the template structures 18 shown in FIG. 1A, the template structures 18 are formed by spin-coating a resist on the surface 12 of the substrate 14. The single dot post template structures are formed from the resist. The resist may be made of any type of suitable resist such as hydrogen silsequixane (HSQ), PMMA, ZEP resists, and/or the like. In particular, scanning electron-beam lithography may be used to induce a chemical change to the resist, whereby development of the resist forms the single dot post structures from the resist.

The template region 10, including the template structures 18 and the surface 12, is then functionalized with a homopolymer brush. With regard to block copolymers, functionalization of the template region 10 may include coating the template region 10 with one of the blocks. For example, for a diblock copolymer, either the majority block or the minority block of the diblock copolymer may be used to functionalize the template region 10. The functionalization creates forces that orient self-assembly of the self-assembly material on the template region 10. Alternately, a different type of material that has the ability to provide repelling and/or attracting forces on the self-assembly material can be used to functionalize the template region 10. In this particular embodiment, minority block functionalization is utilized to functionalize the template region 10. This results in the minority block of the diblock copolymer becoming attracted to the template structures 18, and thus guiding self-assembly.

Figure 1B:
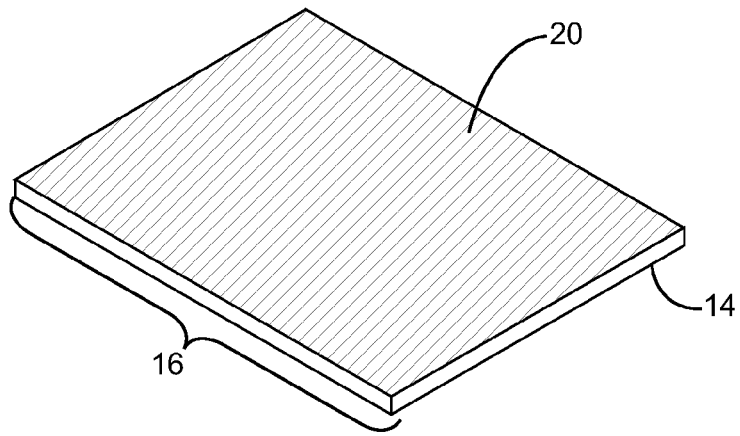
FIG. 1B illustrates the substrate shown in FIG. 1A with a self-assembling material coated on the template region prior to self-assembly.

FIG. 1B illustrates one embodiment of the substrate 12 with a self-assembling material 20 coated on the template region 10. The self-assembling material 20 is a diblock copolymer, which in this example is PS-b-PDMS. The self-assembling material 20 has been spin-coated on the template region 10, and is shown in FIG. 1B prior to self-assembly. The self-assembling material 20 is thus in a high entropy configuration where the PS-b-PDMS molecules are unorganized. PS in the PS-b-PDMS molecules are the majority block, while the minority block is PDMS. The PDMS molecules are attracted to one another to form a covalent bond, but the PS molecules repel one another. Note that in this example, PDMS has also been used to functionalize the template region 10.

Figure 1C:
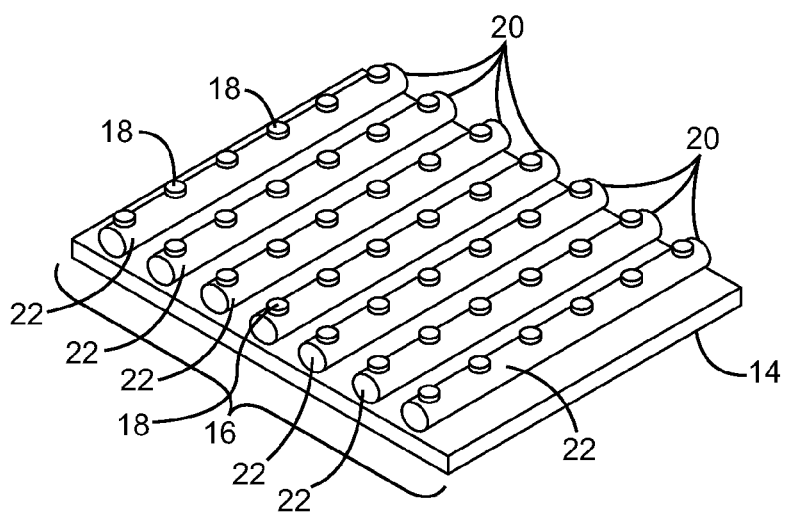
FIG. 1C illustrates the self-assembling material shown in FIG. 1B on the template after the self-assembling material has self-assembled into cylinders.

FIG. 1C illustrates the self-assembling material 20 after self-assembly on the template region 10. As shown in FIG. 1C, the self-assembling material 20 self-assembles into a plurality of self-assembled structures, which in this example are cylinders 22, and more specifically, in-plane cylinders. Since the template region 10 has been annealed by the PDMS block, while the self-assembling material 20 is self-assembling, the self-assembling material 20 is attracted to the template structures 18 in the template region 10 of the substrate 14. Thus, each of the cylinders 22 is attracted to and connects to the template structures 18. In this example, each of the cylinders 22 is oriented by a row of template structures 18 so that each section of the cylinders 22 interconnects the template structures 18. In an alternative embodiment, the other block (in this example, PS) is used to functionalize the template region 10. In this alternative embodiment, each of the cylinders 22 may form between rows or columns of the template structures 18. In this embodiment, the PS block has been etched after self-assembly; thus, the cylinders 22 are made of PDMS.

Note that while in this embodiment a single layer of cylinders 22 was formed from the self-assembling material 20, in other embodiments, multiple layers, each with a plurality of cylinders 22, may be formed from the self-assembling material 20, as long as the appropriate thickness and temperature conditions are provided during self-assembly. These multiple monolayers may be provided in a meshlike structure relative to one another, wherein in one layer of the cylinders 22, the cylinders 22 are parallel to the rows of the template structures 18, while in another layer of the cylinders 22, the cylinders 22 are oriented perpendicularly to the rows of the template structures 18. Thus, by controlling the characteristics of the template structures 18, the self-assembly and orientation of the self-assembled structures (which in this case are cylinders 22) can be controlled.

FIG. 2 illustrates one embodiment of a computer system 23 operable to form the template region 10 shown in FIG. 1A. Furthermore, the computer system 23 is operable to coat the template region 10 with the self-assembling material 20, and is also configured to provide the appropriate conditions that trigger the self-assembly of the self-assembling material 20. The computer system 23 includes a central processing core 24, which may include one or more microprocessors. The central processing core 24 also includes local memory 26. The local memory 26 may be provided with one or more memory devices, such as RAM, registers, a flash memory device, and/or the like. The local memory 26 may store computer-executable instructions that are executable by the central processing core 24.

The computer system 23 also includes non-volatile memory 28. The non-volatile memory 28 may be provided by one or more memory devices, such as hard drives and/or the like. The central processing core 24 and the non-volatile memory 28 may be connected by a local bus 30. Computer-executable instructions may be written and stored in the non-volatile memory 28 and may be passed to the local memory 26 via the local bus 30 for execution by the central processing core 24. Data objects with parameter values may be stored in the local memory 26 and the non-volatile memory 28 for use by the central processing core 24 when executing the computer-executable instructions.

The computer system 23 also includes a network interface 32, which may include one or more network interface devices. In this embodiment, the network interface 32 provides a link to a network 34. The network 34 may include different types of networks, such as local area networks; wide area networks; public networks, such as the Internet; wireless networks; mobile communication networks; and/or the like.

In this embodiment, the computer system 23 includes a database 36. The database 36 includes database memory 38 that may store computer-executable instructions and data objects with parameter values. The database 36 may have an internal processing core and memory that allow the database 36 to implement search queries to the database memory 38. In this embodiment, the database 36 includes a network interface 32 that forms a link to the network 34. Computer-executable instructions and data objects stored in the database memory 38 may be passed to the central processing core 24 via the network 34. More specifically, the database 36 may pass computer-executable instructions and data objects to the network 34, and then to the network interface 32. The network 34 may then pass the computer-executable instructions and data objects to the network interface 32, and then to the local bus 30. The local bus 30 may then transfer the computer-executable instructions and data objects to the local memory 26 for use in execution by the central processing core 24 or to the non-volatile memory 28 for later use by the central processing core 24.

As shown in FIG. 2, the computer system 23 includes a nanotechnology fabrication device 40. The central processing core 24 is operably associated with the nanotechnology fabrication device 40 to control fabrication and receive data objects describing empirical information generated by the nanotechnology fabrication device 40. More specifically, in this embodiment, the computer system 23 includes control hardware 42. The control hardware 42 is operable to generate a set 44 of control outputs and to receive a set 46 of control inputs from the nanotechnology fabrication device 40. The set 44 of control outputs may include control signals, control words, data fields, and the like. The set 46 of control inputs may include control signals, feedback signals, measurement parameters, control words, imaging data, and the like.

The central processing core 24 may execute computer-executable instructions in the local memory 26 and passed from either the non-volatile memory 28 or the database memory 38. The control hardware 42 may be linked by the local bus 30 to the central processing core 24, which may send commands and data as a result of the computer-executable instructions in order to control the nanotechnology fabrication device 40. The commands and data may be translated by the control hardware 42 into the control outputs in the set 44. The nanotechnology fabrication device 40 is responsive to the set 44 of the control outputs in order to perform and provide nanotechnology fabrication functionality. Similarly, the nanotechnology fabrication device 40 may output the set 46 of control inputs, which may be translated by the control hardware 42 and sent to the central processing core 24 through the local bus 30. The central processing core 24 may then utilize the set 46 of control inputs so as to provide control functionality in accordance with the computer-executable instructions. Also, the central processing core 24 may generate display outputs that are communicated through the local bus 30 to one or more displays 48. In this manner, technicians, scientists, and/or fabricators can view visual representations of data relevant to the nanotechnology fabrication process.

Figure 2A:
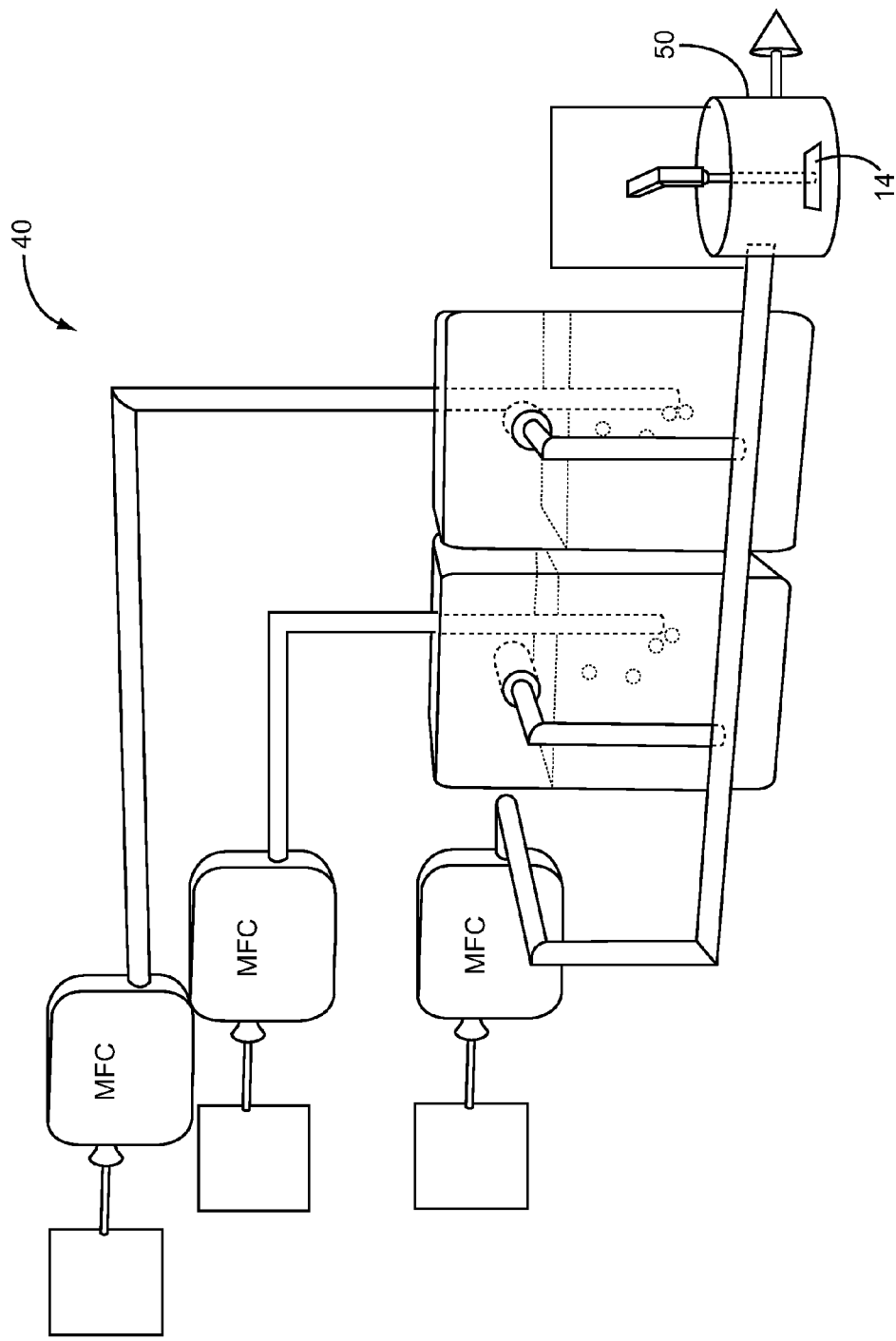
FIG. 2A illustrates one embodiment of the nanotechnology fabrication device shown in FIG. 2.

FIG. 2A illustrates an exemplary nanotechnology fabrication device 40 as shown in FIG. 2. A nanotechnology fabrication process may be performed with the nanotechnology fabrication device 40 shown in FIG. 2A. The substrate 14 is placed in a reaction chamber 50. The nanotechnology fabrication device 40 may further include a scanning electron microscope, brushes, a light-focusing component for lithography, and/or the like. These devices may be controlled with the set 44 of control outputs shown in FIG. 2, and may provide control inputs in the set 46 to the central processing core 24. In addition, the nanotechnology fabrication device 40 has a plurality of storage vessels that store different chemicals relevant to the nanotechnology fabrication process. These chemicals may be introduced into the reaction chamber 50 via inlets. The introduction of these chemicals into the reaction chamber 50 may be controlled by various mass flow controllers (MFCs). These MFCs may be responsive to particular control outputs in the set 44 shown in FIG. 2, and thus the central processing core 24 is configured to control the flow of these chemicals into the reaction chamber 50 in accordance with the executed computer-executable instructions. As described in further detail below, the central processing core 24 shown in FIG. 2 is configured to execute the computer-executable instructions so that procedures are performed in order to provide standardized topographical configurations for template regions.

FIG. 3 illustrates exemplary procedures for a method of providing standardized topographical configurations for template regions that orient self-assembly. In this embodiment, the procedures described herein may be performed by the computer system 23 shown in FIG. 2. However, any suitable computer system may implement the procedures described herein. Initially, the central processing core 24 may select a set of array arrangements (procedure 1000). Each array arrangement represents an arrangement of an array of template structures (for example, the template structures 18 shown in FIG. 1A). Thus, each array arrangement may be a data object that represents the array arrangement in any suitable manner. For example, the data object may be a representation of an array or may include data fields with parameters describing the array arrangement, or both. The array arrangements in the set may represent arrangements for arrays of any type of suitable template structure (such as the template structures 18 shown in FIG. 1A), or in addition, array arrangements for arrays with different types of template structures. For example, the template structure representations may be, or include, single dot post template structure representations, double dot post template structure representations, triple dot post template structure representations, dash post template structure representations, multiple dash post template structure representations, or any other type of template structure representation for any type of template structure that may be provided in a template region (such as the template region 10 shown in FIG. 1A) in an array.

After the set of array arrangements has been selected, the nanotechnology fabrication device 40 forms arrays of template structures on at least one substrate (procedure 1002). For instance, the central processing core 24 may execute computer-executable instructions that result in the nanotechnology fabrication device 40 forming the arrays of template structures on one or more substrates. Each of the arrays is arranged in accordance with an array arrangement in the set of array arrangements such that the arrays correspond surjectively onto the set of array arrangements. Thus, for each of the array arrangements in the set of array arrangements, one or more arrays with that arrangement is formed on a template region of a substrate, or on multiple template regions of various substrates.

For the sake of clarity, the remainder of this application assumes that the arrays are provided as sub-arrays within the overall template region array of a single substrate, such as the substrate 14 illustrated in FIG. 1A. However, it should be noted that multiple substrates with multiple template regions may be formed with arrays configured in accordance with the set of array arrangements. These arrays may be provided as sub-arrays within the various overall template region arrays. In some embodiments, the arrays in a first template region of a first substrate may include arrays arranged in accordance with a proper subset of the set of array arrangements, while template regions of other substrates may include other proper subsets of the set of array arrangements. In contrast, each template region of multiple substrates may include arrays with all of the array arrangements in the set of array arrangements. This, of course, may depend on organizational preferences or the requirements of a particular application.

Next, the central processing core 24 may map a set of self-assembly pattern arrangements surjectively onto the set of array arrangements based on the self-assembly patterns empirically observed to have been formed by the self-assembling material as a result of the arrays (procedure 1004). For example, the self-assembling material may be coated on the template region of the substrate (or on template regions of various substrates in multiple-substrate applications) that was formed by the nanotechnology fabrication device 40 in procedure 1002. As mentioned above, the arrays may be provided as sub-arrays within the overall template region array of the substrate. Self-assembly of the self-assembling material may then be triggered. (An example of self-assembly is described above with respect to FIG. 1C.) The section of the self-assembling material provided on one of the arrays self-assembles to form a self-assembly pattern. This self-assembly pattern is a result of the array arrangement of the array, which was selected as described above with respect to procedure 1000. In other words, the array was formed in accordance with the geometrical and spatial characteristics defined by the particular array arrangement in the set of array arrangements used to form the array. Due to functionalization, these geometrical and spatial characteristics of the array orient self-assembly of the section of the self-assembling material on the array. As such, the array results in the section of the self-assembly material self-assembling in a particular self-assembly pattern. Since each of the array arrangements in the set of array arrangements defines geometrical and spatial characteristics for the various arrays, self-assembly of the self-assembling material results in various self-assembling patterns, depending on the array arrangement used to form the array.

The self-assembly patterns resulting from each of the arrays can be empirically observed using the instrumentation of the nanotechnology fabrication device 40. The central processing core 24 may execute computer-executable instructions that utilize control inputs from the set 46 of control inputs to generate a self-assembly pattern arrangement that defines the arrangement of the self-assembly pattern resulting from the different arrays. On the other hand, if the self-assembly pattern is identical to, or essentially the same as, the self-assembly pattern resulting from another array arranged in accordance with the same array arrangement, the central processing core 24 may not generate another self-assembly pattern arrangement with the same pattern, but may simply add to a tally that keeps up with the number of arrays with that array arrangement that resulted in a self-assembly pattern that can be described by the same previously generated self-assembly pattern arrangement.

A set of self-assembly pattern arrangements can thus be generated in this manner. In one embodiment, the set of self-assembly pattern arrangements comprises one or more data objects. These data objects may represent the actual self-assembly patterns, or may simply include data fields with parameters describing the geometrical and spatial characteristics of the self-assembly patterns. Additionally or alternatively, the data objects may both represent the actual self-assembly patterns and include parameters describing the geometrical characteristics of the self-assembly patterns.

By maintaining a record of the array arrangements used for each of the arrays, and the self-assembly pattern arrangements for the self-assembly patterns resulting from each of the arrays, the central processing core 24 can map the set of self-assembly pattern arrangements surjectively onto the set of array arrangements. Thus, each of the array arrangements in the set of array arrangements corresponds to one or more self-assembly pattern arrangements in the set of self-assembly pattern arrangements. In some instances, the set of self-assembly pattern arrangements is also mapped injectively to the set of array arrangements. As such, when the set of self-assembly pattern arrangements is mapped both surjectively onto the set of array arrangements and injectively to the set of array arrangements, the central processing core 24 has mapped the set of array arrangements bijectively to the set of self-assembly pattern arrangements. In other words, there is one-to-one correspondence between the set of self-assembly pattern arrangements and the set of array arrangements such that every array arrangement in the set of array arrangements has been mapped to exactly one of the self-assembly pattern arrangements.

For example, each array arranged in accordance with the same array arrangement may have resulted in self-assembly patterns that are identical, or at least geometrically and spatially indistinguishable, given the relevant parameters and/or simplifying assumptions used to generate self-assembly pattern arrangements. Accordingly, each array arranged with the same array arrangement in the set of array arrangements has resulted in identical self-assembly patterns, and thus these self-assembly patterns can be described as arranged in accordance with the same self-assembly pattern arrangement. Thus only one self-assembly pattern arrangement maps to the array arrangement, because arrays with this array arrangement always result in identical self-assembly patterns. Thus, there is only one self-assembly arrangement that could map to the array arrangement. If this is the case for every one of the array arrangements in the set of array arrangements (i.e., for every array arrangement in the set of array arrangements, arrays with that array arrangement always result in the same identical self-assembly pattern), the empirical results require bijective mapping.

Alternatively, arrays arranged in accordance with the same array arrangement may not always result in self-assembly patterns that are identical and indistinguishable. Thus, for one or more of the array arrangements, the self-assembly patterns for the same array arrangement cannot all be described with a common self-assembly pattern arrangement. Instead, more than one self-assembly pattern arrangement would need to be used in order to describe the different self-assembly patterns resulting from that array arrangement. Nevertheless, in some cases, or in some embodiments, the central processing core 24 may still map the set of self-assembly pattern arrangements injectively to the set of array arrangements. Thus, not only would the set of self-assembly pattern arrangements map surjectively onto the set of array arrangements, the central processing core 24 may also map the set of array arrangements injectively to the set of self-assembly pattern arrangements so that the set of array arrangements maps bijectively to the set of self-assembly pattern arrangements. To do this, exactly one of the self-assembly pattern arrangements may be selected from the various different self-assembly pattern arrangements resulting from arrays with the same array arrangement that resulted in the various self-assembly patterns. This may be the self-assembly pattern arrangement that most consistently is the result of arrays with this same array arrangement. This may be done using the tallies described above. More specifically, the different self-assembly arrangements that result from arrays with the same array arrangement are counted, and the self-assembly pattern arrangement with the highest tally is selected to be in the set of self-assembly arrangements, while the other self-assembly pattern arrangements with lower tallies are excluded from the set of self-assembly pattern arrangements. This exclusion allows the set of self-assembly pattern arrangements to be bijectively mapped to the set of array arrangements.

In different cases, or in alternative embodiments, the central processing core 24 may map the self-assembly pattern arrangements surjectively onto the set of array arrangements, but not map the set of array arrangements injectively to the set of self-assembly patterns. Thus, the mapping would not be bijective mapping, and would only meet the requirements of surjective mapping. In this case, for every array arrangement in the set of array arrangements that requires multiple self-assembly pattern arrangements to describe the different self-assembly patterns resulting from the particular array arrangement, each of the self-assembly pattern arrangements in a subset of the self-assembly pattern arrangements may be mapped to the same array arrangement. Given that there are multiple self-assembly pattern arrangements mapped to the same array arrangement, this subset of self-assembly pattern arrangements for the same array arrangement may be selectable based on control inputs related to the self-assembly of the self-assembly material. In other words, the self-assembly pattern arrangement of the subset of self-assembly pattern arrangements for the particular array arrangement that is selected may depend on design parameters or inputs related to self-assembly.

In one embodiment, the central processing core 24 is configured to execute computer-executable instructions, which result in the central processing core 24 either performing the procedures in FIG. 3 or controlling the nanotechnology fabrication device 40 through the control hardware 42 to perform the procedures. For each procedure, there may be sub-procedures which are performed entirely by the central processing core 24, or the central processing core 24 may control the nanotechnology fabrication device 40 so that the nanotechnology fabrication device 40 performs the sub-procedure. Thus, in some embodiments, each of the procedures shown in FIG. 3, or one or more of the procedures shown in FIG. 3, may be performed partially by the central processing core 24 on its own, and partially by the nanotechnology fabrication device being controlled by the central processing core 24.

Additionally, the computer-executable instructions may be organized as one or more software modules in order to provide the functionality described above. As is apparent to one of ordinary skill in the art, any system that uses software modules implemented using computer-executable instructions and general-purpose computer hardware, such as one or more processors in the central processing core 24, has a hard-wired hardware circuit analog that utilizes hard-wired hardware specifically configured to provide the same functionality as the software module. Accordingly, this disclosure does not intend to limit the systems described herein to software implementations. Instead, these systems may be implemented using software modules, hard-wired hardware circuits, or some combination of both software modules and hard-wired hardware circuits. All of these implementations are considered to be within the scope of this disclosure. Furthermore, the mapping of the set of self-assembly pattern arrangements and the set of array arrangements may be done in any suitable manner for linking one set of data with another set of data.

In one embodiment, the central processing core 24 is configured to execute computer-executable instructions, which result in a mapping data output. The mapping data output may be a data structure that includes both the set of self-assembly pattern arrangements and the set of array arrangements, in addition to linking information that maps the set of self-assembly pattern arrangements to the set of array arrangements. This mapping data output may then be provided as part of a library that may be utilized to construct a template region on the substrate so that the self-assembling material forms a target self-assembly pattern. This is explained in further detail below. Alternatively, the mapping data output may simply be a set of function values that define a mapping function, wherein the central processing core 24 may execute computer-executable instructions that use the set of function values to implement the mapping function. These and other techniques for mapping the set of self-assembly pattern arrangements surjectively onto the set of array arrangements would be apparent to one of ordinary skill in the art in light of this disclosure.

Figure 4A:
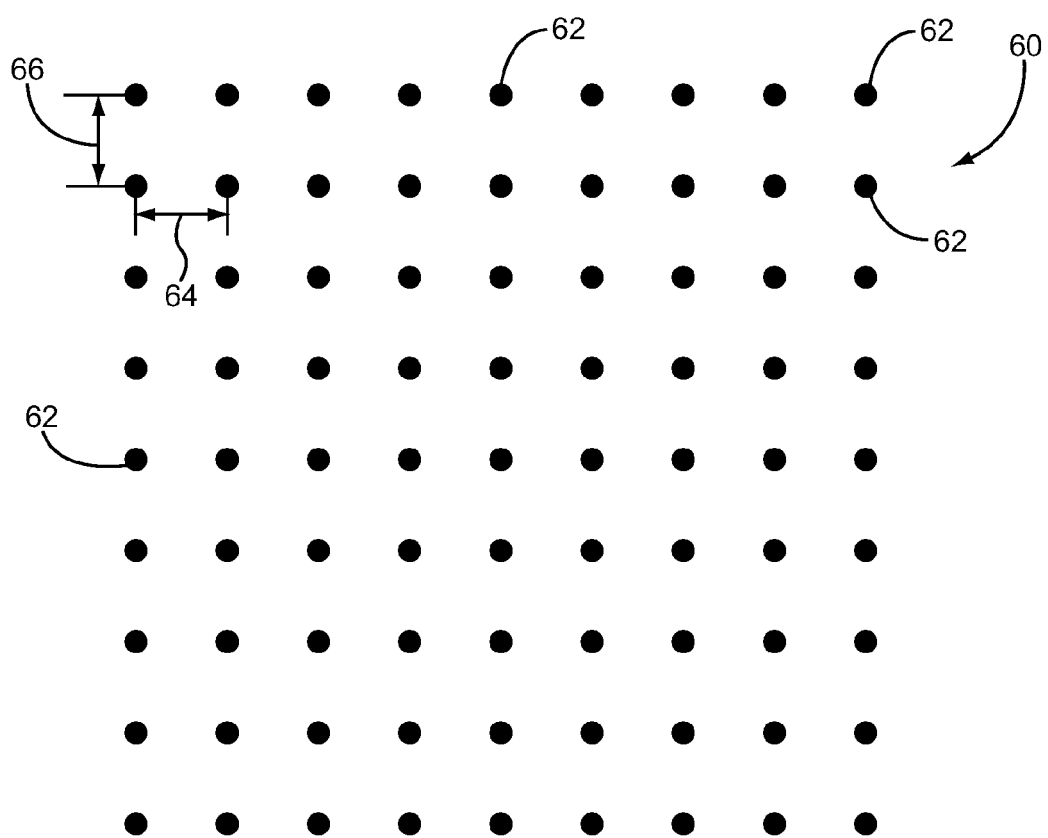
FIGS. 4A-4H are related to one embodiment of sub-procedures that may be performed by the computer system shown in FIG. 2 in order to select a set of array arrangements, as described by a first one of the procedures illustrated in FIG. 3.

FIGS. 4A-4D are related to sub-procedures that may be implemented by the computer system 23 in FIG. 2 in order to perform one embodiment of the procedure 1000 described above with respect to FIG. 3. FIG. 4A is a visual graph illustrating information that may be represented by an initial template region array arrangement having a square array arrangement. For example, the initial template region arrangement may be a data object that defines an arrangement for forming an actual template region and/or represents the various features for forming the actual template region. Accordingly, while the initial template region arrangement in FIG. 4A is described visually in FIG. 4A, FIG. 4A is simply a visual illustration of the information described by the data object (i.e., the initial template region array arrangement). As shown in FIG. 4A, the initial template region arrangement defines an arrangement 60 of template structure representations 62. The template structure representations 62 may represent any type of template structure, depending on the type of array being represented. In this embodiment, the template structure representations 62 are all of the same type. In this example, the template structure representations 62 are each of a single dot post template representation type, which represents a single dot post template structure. Alternative embodiments may use different types of template structure representations 62 to represent different types of template structures, such as dash template structures, double post template structures, triple post template structures, and/or the like.

In this embodiment, the arrangement 60 is a representation of a square array of the template structure representations 62. Other types of arrangements may be utilized for other types of arrays, such as rectangular arrays, hexagonal arrays, or any other type of arrangement that is suitable for a particular application. The spacing of the array arrangement may be defined by one or more parameters. For example, the arrangement 60 is two-dimensional with respect to the represented positions of the template structure representations 62 on a template plane. One in-plane direction may be defined as the X direction, which may be considered to be the direction parallel to the rows of template structure representations 62. Another in-plane direction may be defined as orthogonal to the X direction but within the template plane. Thus, in this embodiment, the other template direction may be defined to be parallel to the columns of the template structure representations 62 within the template plane. The frequency of the posts of the template structure representation 62 in the X direction may be defined by a periodicity parameter whose value defines a distance 64 between the posts of the template structure representations 62 in the X direction. In an alternative example, an intrinsic periodicity parameter may be utilized to define a distance 66 and post-period ratios for the X direction and a Y direction. In this embodiment, the distance 66 is the intrinsic periodicity at which the self-assembling material naturally forms self-assembling structures (in this case, in-plane cylinders) without a template. Thus, the distance 64 can be defined by the intrinsic periodicity parameter and the post-period ratio for the X direction, so that the distance 64 is equal to a multiple of the intrinsic periodicity parameter. The intrinsic periodicity parameter and the post-period ratio for the Y direction can represent the distance 66 in the same manner. In this embodiment, the arrangement 60 represents a square array, and thus, the distance 64 and the distance 66 are the same. However, these parameters can be varied so that the arrangement 60 represents different array arrangements. Thus, if the distance 64 and the distance 66 are not equal, rectangular array arrangements would be represented.

The parameters for the distance 64 and the distance 66 can be varied so that the arrangement 60 represents different array arrangements. This may be done in order to determine a degenerate array arrangement. The degenerate array arrangement defines an array of template structure representations 62, wherein a template region of a substrate arranged in accordance with the degenerate array arrangement results in self-assembly of the self-assembling material with self-assembly structures oriented either parallel to the rows of the template structures 18 (oriented in the X direction), or parallel to the columns of the template structures 18 (oriented in the Y direction). As shown in FIG. 1C, the template region 10 of the substrate 14 is arranged in accordance with a degenerate array arrangement because the cylinders 22 are all oriented in a direction parallel to the rows of the template structures 18. This indicates that a degenerate distance between adjacent template structures 18 within the same column of the template structures 18 do not affect the orientation of self-assembly. Thus, the cylinders 22 are oriented to be aligned with the rows in the X direction, and the orientation has no Y-direction component. Accordingly, when the template structures 18 and the adjacent template structures 18 are separated by this distance (in this case, the distance between adjacent template structures 18 in the same column), the adjacent template structure 18 does not change the orientation of the self-assembly. Thus, all of the cylinders 22 shown in FIG. 1C simply run parallel to the rows.

Figure 4B:
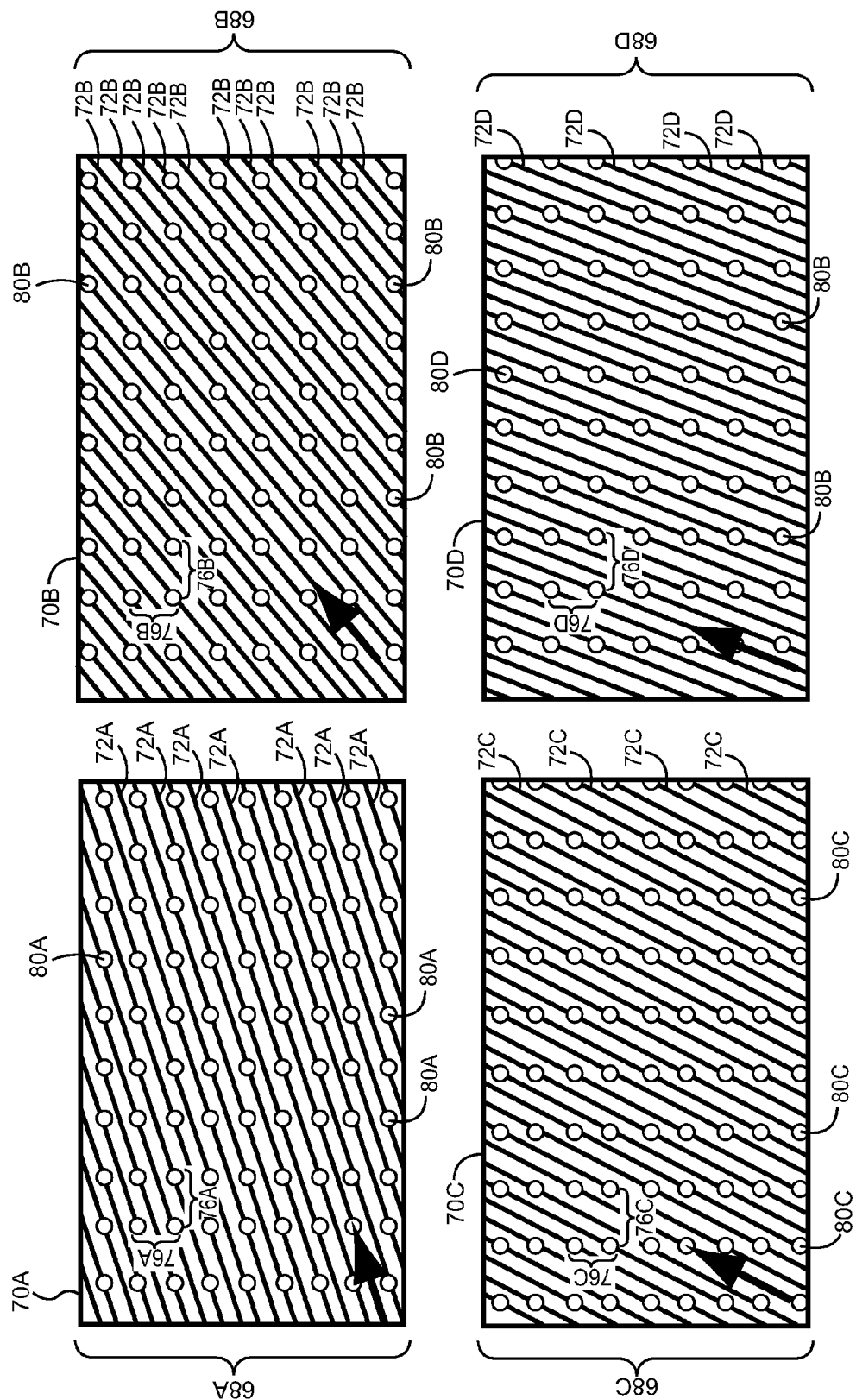

FIG. 4B illustrates template regions 68A, 68B, 68C, 68D formed in accordance with the arrangement 60 as the parameters of the arrangement 60 are varied. Also shown in FIG. 4B are cylinders 72 resulting from the self-assembly of a self-assembling material as a result of the various template regions. For example, the template region 68A formed on substrate 70A results in cylinders 72A. In this case, a distance 76A in the X direction was 56 nm, and a ratio of a distance 78A in the Y direction to the distance 76A was 1.5. The cylinders 72A are not oriented either parallel to the rows of template structures 80A or to the columns of the template structures 80A. Thus, the template region 68A is not arranged in accordance with a degenerate array arrangement. Rather, the cylinders 72A are angled to about 18° with respect to the X direction.

FIG. 4B also illustrates another template region formed in accordance with the arrangement 60 as the parameters of the arrangement 60 are varied. The template region 68B formed on substrate 70B results in cylinders 72B. In this case, a distance 76B in the X direction was 54 nm, and a ratio of a distance 78B in the Y direction to the distance 76B was 1.15. The cylinders 72B are not oriented either parallel to the rows of template structures 80B or to the columns of the template structures 80B. Thus, the template region 68B is not arranged in accordance with a degenerate array arrangement. Rather, the cylinders 72B are angled to about 41° with respect to the X direction.

FIG. 4B also illustrates still another template region formed in accordance with the arrangement 60 as the parameters of the arrangement 60 are varied. The template region 68C formed on substrate 70C results in cylinders 72C. In this example, a distance 76C in the X direction was 60 nm, and a ratio of a distance 78C in the Y direction to the distance 76C was 1.5. The cylinders 72C are not oriented either parallel to the rows of template structures 80C or to the columns of the template structures 80C. Thus, the template region 68C is not arranged in accordance with a degenerate array arrangement. Rather, the cylinders 72C are angled to about 68.4° with respect to the X direction.

FIG. 4B also illustrates yet another template region formed in accordance with the arrangement 60 as the parameters of the arrangement 60 are varied. The template region 68D formed on substrate 70D results in cylinders 72D. In this example, a distance 76D in the X direction was 57 nm, and a ratio of a distance 78D in the Y direction to the distance 76D was 1.15. The cylinders 72D are not oriented either parallel to the rows of template structures 80D or to the columns of template structures 80D. Thus, the template region 68D is not arranged in accordance with a degenerate array arrangement. Rather, the cylinders 72D are angled to about 68.9° with respect to the X direction.

Figure 4C:
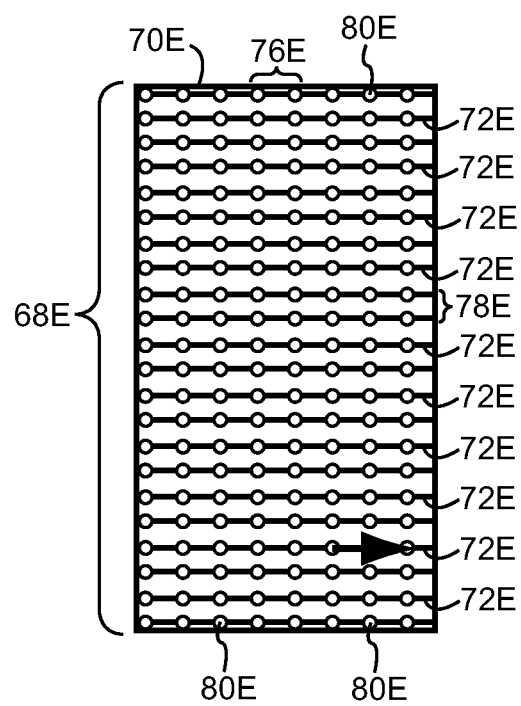

Next, FIG. 4C illustrates another template region formed in accordance with the arrangement 60 as the parameters of the arrangement 60 are varied. As shown in FIG. 4C, template region 68E is formed on substrate 70E is formed in accordance with a degenerate array arrangement. In this example, cylinders 72E are formed on the template region 68E from the self-assembling material, which in this example is PS-b-PDMS. The cylinders 72E are thus formed from the PDMS after the etching of the PS. A distance 76E in the X direction is 56 nm, while a degenerate distance 78E in the Y direction is 35 nm. As such, the degenerate distance 78E has been empirically determined to be the intrinsic periodicity (Lo) of the self-assembling material. The cylinders 72E are all oriented in a direction parallel to the rows of template structures 80E. Accordingly, the template region 68E is arranged in accordance with a degenerate array arrangement. At the degenerate distance 78E, the adjacent template structures do not affect the orientation of the cylinders 72E. Utilizing the parameters used to form the template region 68E, the central processing core 24 may implement computer-executable instructions to generate a degenerate array arrangement, this time with a square array arrangement associated with parameters that define the degenerate distance 78E in both the X direction and the Y direction.

Figure 4D:
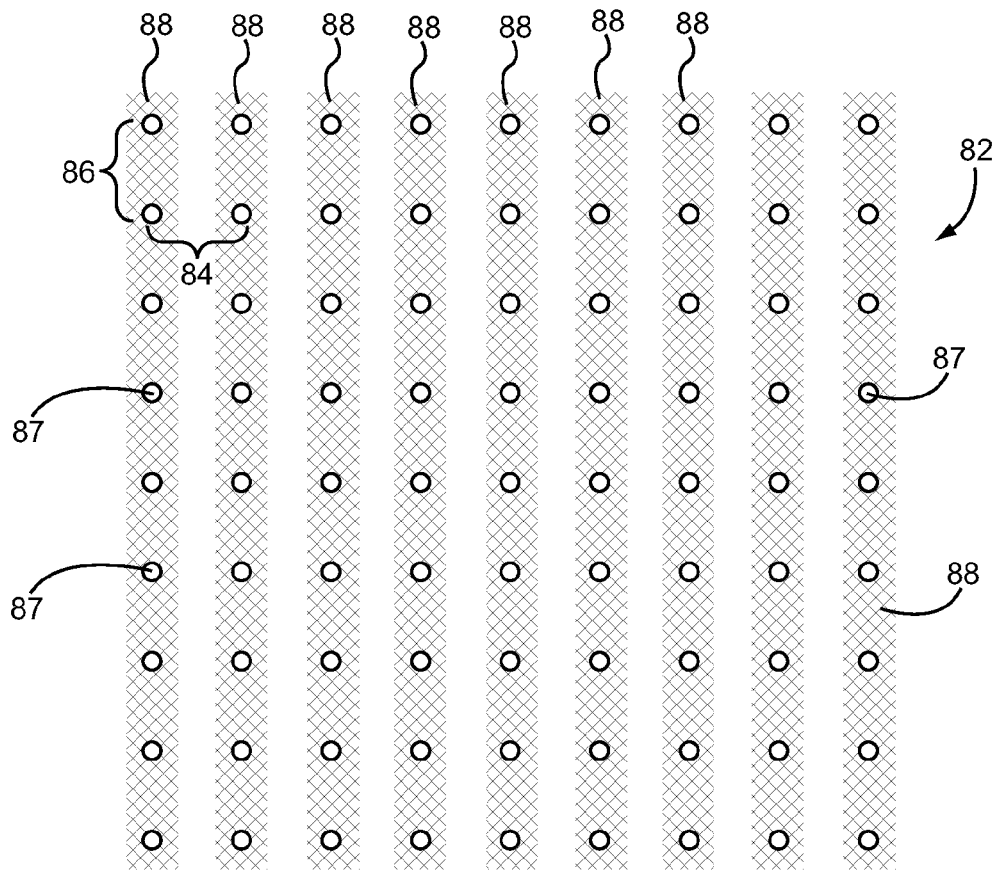

FIG. 4D is a visual representation of a degenerate array arrangement 82 created utilizing the parameters that define the degenerate distance 78E for the template region 68E. The degenerate array arrangement 82 is a square degenerate array arrangement. In this example, a distance 84 in the X direction and a distance 86 in the Y direction are both equal to the degenerate distance 78E. Thus, a post-periodicity ratio in the X direction and a post-periodicity ratio in the Y direction are equal. The template post-periodicity distance parameter has a value of 35 nm, which was the distance 78E in the Y direction of the template region 68E shown in FIG. 4C. Thus, template structure representations 87 in the degenerate array arrangement 82 have a template periodicity distance parameter that is set to 35 nm. The degenerate array arrangement 82 represents the distance 84 in the X direction and the distance 86 in the Y direction, both equaling 35 nm. Cylinder representations 88 represent one possible orientation of cylinders resulting from self-assembly utilizing the degenerate array arrangement 82. In this example, the cylinder representations 88 are each oriented so as to be parallel to the columns of the template structure representations 87 in the Y direction.

Figure 4E:
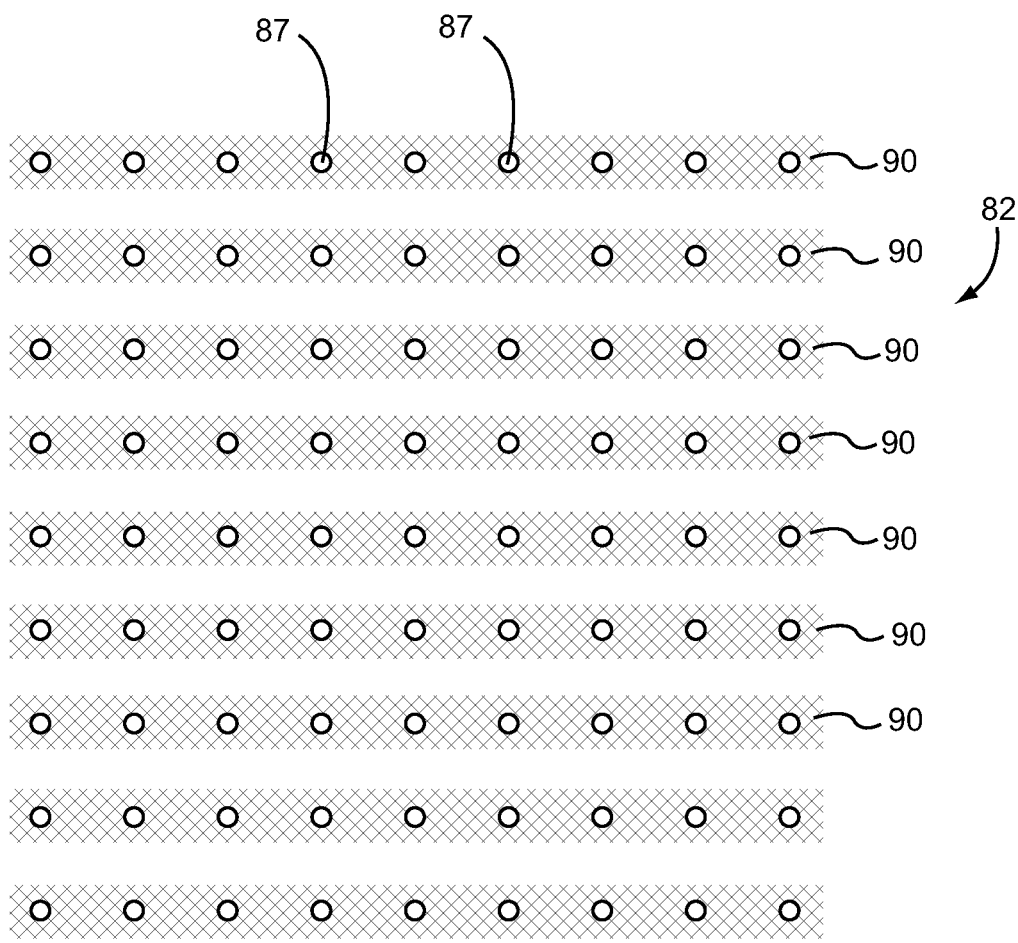

FIG. 4E is a visual representation of the same degenerate array arrangement 82, except in this embodiment, cylinder representations 90 are oriented to represent cylinders that are parallel to the X direction. In other words, the cylinder representations 90 are all oriented so as to be parallel to the rows of the template structures. In the embodiment of the degenerate array arrangement 82 shown in FIGS. 4D and 4E, each of the template structure representations 87 is of the same type. More specifically, in this embodiment, the template structure representations 87 are each a single dot post template structure representation of a single dot post template structure. Since the parameters for both the distance 84 and the distance 86 have been set to 35 nm, which is the degenerate distance 78E in FIG. 4C, the cylinder representations 88 and the cylinder representations 90 are shown parallel to the rows and columns, respectively, because adjacent single dot post template structures separated by the degenerate distance 78E either cannot change the orientation of the cylinders, or change the orientation of the cylinders in a random manner. Using the degenerate array arrangement 82, the central processing core 24 may execute computer-executable instructions used to generate various possible array arrangements, where these array arrangements can orient self-assembly in a consistent manner.

Figure 4F:
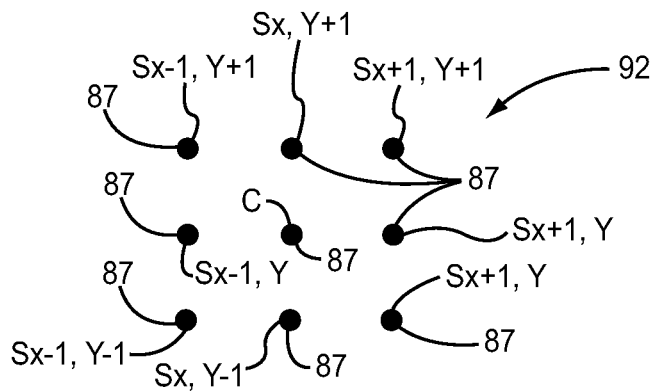

In this regard, FIG. 4F illustrates a degenerate unit cell 92 based on the degenerate distance 78E. The degenerate unit cell 92 is simply a group of template structure representations 87 with a central template structure representation C and the surrounding template structure representations (the surrounding template structure representations are referred to generically as element S, and specifically as surrounding template structure representations $S_{x-1, y+1}$, $S_{x, y+1}$, $S_{x+1, y+1}$, $S_{x+1, y}$, $S_{x+1, y-1}$, $S_{x, y-1}$, $S_{x-1, y-1}$, and $S_{x-1, y}$, where if x and y represent the relative position of the central template structure representation C, the subscript for each of the surrounding template structure representations indicates a matrix position of the surrounding template structure representation relative to the matrix position x,y of the central template structure representation C). Since the surrounding template structure representations $S_{x, y+1}$, $S_{x, y-1}$, $S_{x+1, y}$, and $S_{x-1, y}$ are all represented so as to be the distance 84 and the distance 86 (both being parameters that equal the degenerate distance 78E) from the central template structure representation C, the surrounding template structure representations $S_{x, y+1}$, $S_{x, y-1}$, $S_{x+1, y}$, and $S_{x-1, y}$ are not capable of causing an orthogonal orientation change in self-assembly with respect to the central template structure representation C, and the central template structure representation C is not capable of causing an orthogonal change in self-assembly with respect to the surrounding template structure representations $S_{x, y+1}$, $S_{x, y-1}$, $S_{x+1, y}$, and $S_{x-1, y}$. In addition, the surrounding template structure representations S are not capable of effecting an orthogonal change in self-assembly with respect to one another.

Figure 4G:
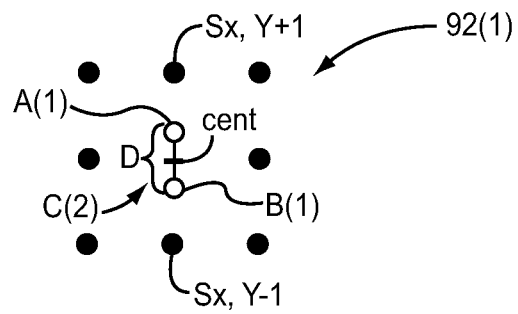

FIG. 4G represents a degenerate unit cell 92(1) based on the degenerate distance 78E, where the central template structure representation C(1) is another template structure type. In this embodiment, the central template structure representation C(1) is a double dot template structure representation. In other words, the degenerate unit cell 92(1) is the same as the degenerate unit cell 92 shown in FIG. 4F, except in FIG. 4G, the central template structure representation C has been replaced with the central template structure representation C(1). Note that while in this embodiment, C(1) is a double-dot post representation, in other embodiments, the central template structure representation C(1) may be of a dash post template structure representation, a triple post template structure representation, a double dash or triple dash post template structure representation, and/or the like. As shown in FIG. 4G, the central template structure representation C(1) is oriented so that each post representation A(1) and B(1) is displaced toward the template structure representations $S_{x, y+1}$ and $S_{x, y-1}$, respectively. In this embodiment, a parameter represents a distance D between the post representation A(1) and the post representation B(1).

In this embodiment, the parameter represents the distance D as being 24 nm. As such, relative to a central position CENT, the post representation A(1) is represented as being a distance D/2 from the central position CENT and a distance equal to the distance 86 minus D/2 from the surrounding template structure representation $S_{x, y+1}$. The post representation B(1) is represented as being a distance D/2 from the central position CENT and a distance equal to the distance 86 minus D/2 from the surrounding template structure representation $S_{x, y-1}$. Hereinafter, the degenerate unit cells with the arrangement described with respect to FIG. 4G are referred to as Y-oriented degenerate unit cells.

Figure 4H:
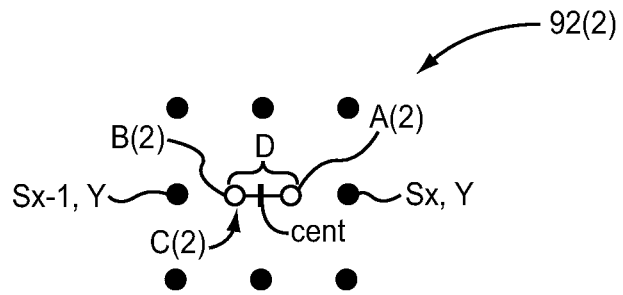

FIG. 4H represents a degenerate unit cell 92(2) based on the degenerate distance 78E, where the central template structure representation C(2) is another template structure type. In this embodiment, the central template structure type C(2) is another double dot post template structure representation. In other words, the degenerate unit cell 92(2) is the same as the degenerate unit cell 92 shown in FIG. 4F, except in FIG. 4F, the central template structure representation C has been replaced with the central template structure representation C(2). Note that while in this embodiment, C(2) is a double dot post template structure representation, in other embodiments, the central template structure representation C(2) may be a dash post template structure representation, a triple post template structure representation, a double dash or triple dash post template structure representation, and/or the like. As shown in FIG. 4H, the central template structure representation C(2) is oriented so that each post representation A(2) and B(2) is displaced toward the template structure representations $S_{x, y+1}$ and $S_{x, y-1}$, respectively.

Relative to the central position CENT, the post representation A(2) is represented as being a distance D/2 from the central position CENT and a distance equal to the distance 84 minus D/2 from the surrounding template structure representation $S_{x+1, y}$. The post representation B(2) is represented as being a distance D/2 from the central position CENT and a distance equal to the distance 84 minus D/2 from the surrounding template structure representation $S_{x-1, y}$. Hereinafter, the degenerate unit cells with the arrangement described with respect to FIG. 4H are referred to as X-oriented degenerate unit cells. The central template structure representations C(1) and C(2) in the degenerate unit cells 92(1), 92(2) represent the template post structure that can determine an orientation change in self-assembly, since the surrounding template structure representations S in the degenerate unit cells 92(1), 92(2) are of the first type, and are positioned in accordance with the degenerate distance 78E.

Next, the central processing core 24 selects the set of array arrangements so that each array arrangement is a different combination of the degenerate unit cells 92(1) and 92(2). To select the set of array arrangements, the central processing core 24 may implement computer-executable instructions to generate the set of array arrangements representing the different combinations of the degenerate unit cells 92(1), 92(2).

FIGS. 5A-5D are visual representations of various array arrangements 94(1), 94(2), 94(3), 94(4) in one embodiment of a set of array arrangements from the degenerate unit cells 92(1), 92(2). In the embodiments illustrated in FIGS. 5A-5D, each of the array arrangements 94(1), 94(2), 94(3), 94(4) is a combination of the degenerate unit cells 92(1), 92(2), wherein each array arrangement 94(1), 94(2), 94(3), 94(4)

includes a representation of a certain number of the degenerate unit cells 92(1) and/or 92(2). In the embodiments illustrated in FIGS. 5A-5D, each of the array arrangements 94(1), 94(2), 94(3), 94(4) has four degenerate unit cells. Also, each of the array arrangements 94(1), 94(2), 94(3), 94(4) in the set of array arrangements has a first quadrant degenerate unit cell, a second quadrant degenerate unit cell, a third quadrant degenerate unit cell, and a fourth quadrant degenerate unit cell.

Mathematically, all of the possible different combinations of four degenerate unit cells with two possible orientations results in sixteen different array arrangements. However, the set of array arrangements represented by FIGS. 5A-5D have a cardinality of four, not sixteen. To do this, each array arrangement in the set of array arrangements is unoriented. This is because various combinations of the array arrangements are the same, except for an array orientation. For example, an oriented array arrangement with four X-oriented degenerate unit cells is the same as an oriented array arrangement of four Y-oriented degenerate unit cells, except that the combination of four Y-oriented degenerate unit cells is rotated by 90° with respect to the combination of four X-oriented degenerate unit cells.

Figure 5A:
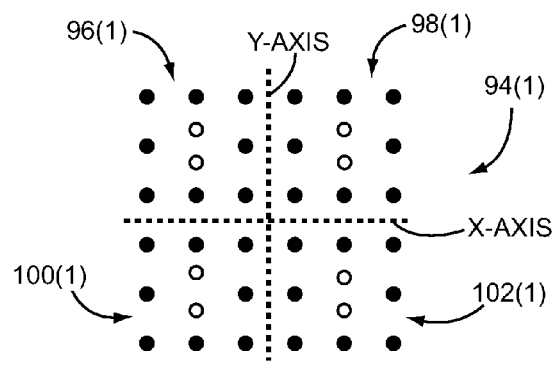

Referring now specifically to FIG. 5A, FIG. 5A illustrates an array arrangement 94(1) in the set of array arrangements. The array arrangement defines a degenerate unit cell 96(1) in a first quadrant, a degenerate unit cell 98(1) in a second quadrant, a degenerate unit cell 100(1) in a third quadrant, and a degenerate unit cell 102(1) in a fourth quadrant. The degenerate unit cells 96(1), 98(1), 100(1), and 102(1) all have the same degenerate unit cell orientation. Given that the array arrangement may be a data object, each of the unoriented array arrangements 94(1), 94(2), 94(3), 94(4) may further include orientation parameters that describe the orientation of the array arrangement. For example, the array arrangement 94(1), as shown in FIG. 5A, includes a Y-oriented degenerate unit cell 96(1), a second Y-oriented degenerate unit cell 98(1), a third Y-oriented degenerate unit cell 100(1), and a fourth Y-oriented degenerate unit cell 102(1).

In this embodiment, the array arrangement 94(1) is an unoriented array arrangement. Thus, the data object that represents the array arrangement 94(1) is defines a reference alignment with respect to the X axis and the Y axis. To describe different oriented array arrangements, an orientation parameter or orientation parameters may be used with the array arrangement 94(1) to describe an arrangement orientation. The array arrangement 94(1) can thus be used to represent two different oriented array arrangements with the orientation parameter(s). For example, an orientation parameter or orientation parameters may be used to describe an arrangement orientation with a rotation of 0° or a rotation of 90°. With the orientation parameter(s) defining the rotation at 0°, an oriented array arrangement is represented at reference, and thus the oriented array arrangement is aligned with the array arrangement 94(1). The oriented array arrangement would have the Y-oriented degenerate unit cell 96(1), the second Y-oriented degenerate unit cell 98(1), the third Y-oriented degenerate unit cell 100(1), and the fourth Y-oriented degenerate unit cell 102(1). However, if the orientation parameter(s) described an arrangement orientation with a 90° rotation, the degenerate unit cells 96(1), 98(1), 100(1), and 102(1) of the oriented array arrangement would be rotated to be X-oriented degenerate unit cells. In one embodiment, the orientation parameter(s) may define the arrangement orientation of an oriented array arrangement with an orientation matrix.

Referring now specifically to FIG. 5B, FIG. 5B illustrates an array arrangement 94(2) in the set of array arrangements. The array arrangement 94(2) defines a degenerate unit cell 96(2) in a first quadrant, a degenerate unit cell 98(2) in a second quadrant, a degenerate unit cell 100(2) in a third quadrant, and a degenerate unit cell 102(2) in a fourth quadrant. In FIG. 5B, the degenerate unit cells 96(2) and 98(2) are X-oriented degenerate unit cells, while the degenerate unit cells 100(2) and 102(2) are Y-oriented degenerate unit cells.

In this embodiment, the array arrangement 94(2) is an unoriented array arrangement. Thus, the data object that represents the array arrangement 94(2) defines a reference alignment with respect to the X axis and the Y axis. To describe different oriented array arrangements, an orientation parameter or orientation parameters may be used with the array arrangement 94(2) that describes an arrangement orientation. Provided that the orientation parameter or orientation parameters define rotations and symmetry flips about the X axis or the Y axis, the unoriented array arrangement 94(2) can represent up to four different oriented array arrangements.

Referring now specifically to FIG. 5C, FIG. 5C illustrates an array arrangement 94(3) in the set of array arrangements. The array arrangement 94(3) defines a degenerate unit cell 96(3) in a first quadrant, a degenerate unit cell 98(3) in a second quadrant, a degenerate unit cell 100(3) in a third quadrant, and a degenerate unit cell 102(3) in a fourth quadrant. The degenerate unit cell 96(3), the degenerate unit cell 100(3), and the degenerate unit cell 102(3) are Y-oriented degenerate unit cells, while the degenerate unit cell 98(3) is an X-oriented degenerate unit cell.

In this embodiment, the array arrangement 94(3) is an unoriented array arrangement. Thus, the data object that represents the array arrangement 94(3) defines a reference alignment with respect to the X axis and the Y axis. To describe different oriented array arrangements, an orientation parameter or orientation parameters may be used with the array arrangement 94(3) that describes an arrangement orientation. Provided that the orientation parameter or orientation parameters define rotations and symmetry flips about the X axis or the Y axis, the unoriented array arrangement 94(3) can represent up to eight different oriented array arrangements.

Figure 5D:
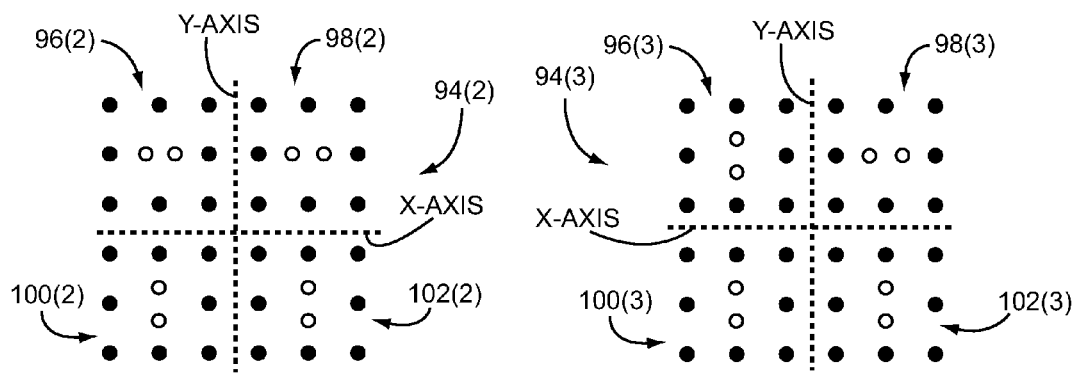
Figure 5D:
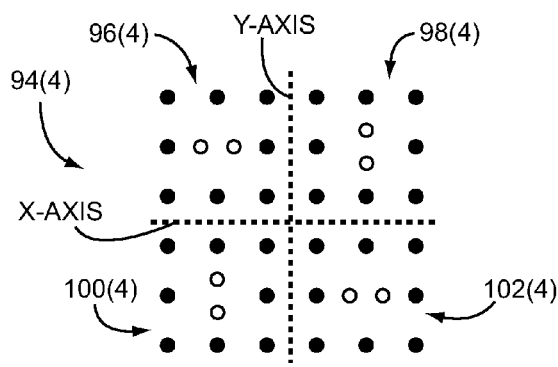

Referring now specifically to FIG. 5D, FIG. 5D illustrates an array arrangement 94(4) in the set of array arrangements. The array arrangement defines a degenerate unit cell 96(4) in a first quadrant, a degenerate unit cell 98(4) in a second quadrant, a degenerate unit cell 100(4) in a third quadrant, and a degenerate unit cell 102(4) in a fourth quadrant. In this embodiment, the degenerate unit cell 96(4) and the degenerate unit cell 102(4) are X-oriented degenerate unit cells. The degenerate unit cell 98(4) and the degenerate unit cell 100(4) are Y-oriented degenerate unit cells.

In this embodiment, the array arrangement 94(4) is an unoriented array arrangement. Thus, the data object that represents the array arrangement 94(4) defines a reference alignment with respect to the X axis and the Y axis. To describe different oriented array arrangements, an orientation parameter(s) may be used with the array arrangement 94(4) that describes an arrangement orientation. Provided that the orientation parameter or orientation parameters define rotations and symmetry flips about the X axis or the Y axis, the unoriented array arrangement 94(4) can represent up to four different oriented array arrangements.

In one embodiment, the central processing core 24 executes computer-executable instructions that generate the set of array arrangements 94(1), 94(2), 94(3), 94(4). Grouping parameters may be used by the central processing core 24 when generating the array arrangements in the set of array arrangements 94(1), 94(2), 94(3), 94(4). For example, the parameters may indicate a number of degenerate unit cells to be included in an array and how those groups of degenerate unit cells are grouped within the array. In FIGS. 5A-5D, the degenerate unit cells 96, 98, 100, 102 are grouped as an array arrangement with four quadrants, where each quadrant has one of the degenerate unit cells. Once the central processing core 24 generates the array arrangement 94(1) shown in FIG. 5A, the array arrangement 94(2) shown in FIG. 5B, the array arrangement 94(3) shown in FIG. 5C, and the array arrangement 94(4) shown in FIG. 5D, the array arrangements 94(1), 94(2), 94(3), 94(4) may be stored in a data structure configured to store the array arrangements as a set of the array arrangements.

FIGS. 6A-6F are related to sub-procedures for implementing one embodiment of the procedure 1002 described above with respect to FIG. 3. More specifically, FIGS. 6A-6F are related to sub-procedures implemented by the computer system 23 in order to form the arrays of template structures with the set of array arrangements 94(1), 94(2), 94(3), and 94(4) illustrated in FIGS. 5A-5D on one or more substrates. For the sake of clarity, and to simplify the following explanation, it is presumed that the arrays are formed on a template region of a single substrate. However, this may or may not be the case, and the arrays may be formed on the template regions of multiple substrates.

Figure 6A:
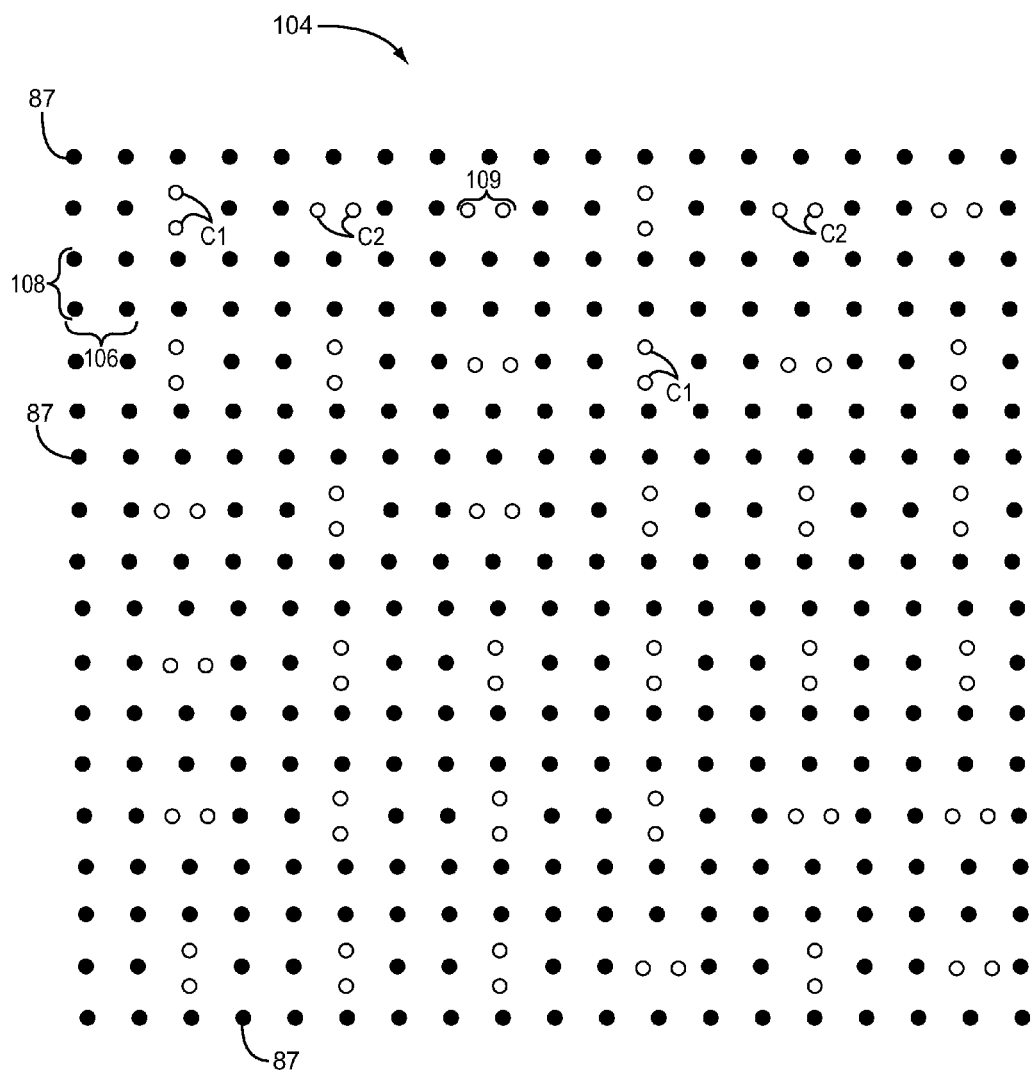

FIG. 6A is a visual representation of a template array arrangement 104 generated by the central processing core 24 that represents a template array for a template region. The template array arrangement 104 has template structure representations 87 of a first type (in this example, single dot post structure representations). In addition, the template region array arrangement 104 has another type of template structure representation, which in this example is template structure representations C1, C2. While the template structure representations C1 and C2 are of the same template structure representation type, the template structure representation C1 and the template structure representation C2 have different orientations, as described above with respect to FIGS. 4G and 4H. In this specific embodiment, the template structure representation C1 is oriented in the X direction, and the template structure representation C2 is oriented in the Y direction.

A parameter or parameters have values that represent a distance 106 between the template structure representations 87 in the X direction, a distance 108 between the template structure representations 87 in the Y direction, and a distance 109 for the single dot post template structure representations of the template structure representations C1, C2. For example, the parameters for the distances 106 and 108 may both equal 35 nm, like the degenerate distance 78E. Each of the template structure representations C1, C2 is surrounded by template structure representations 87, and the distance 109 is 24 nm, in accordance with D in FIGS. 4G and 4H.

The template array arrangement 104 is a data object that defines geometrical, spatial, and structural features, as well as other topological characteristics of a template region. Accordingly, to empirically determine what self-assembly patterns result from arrays with the array arrangements 94(1), 94(2), 94(3), and 94(4), the template array arrangement 104 has array representations with each of the array arrangements 94(1), 94(2), 94(3), and 94(4) in the set of array arrangements. An actual template region is formed with the template array arrangement 104. After the template array arrangement 104 is generated, the central processing core 24 may execute computer-executable instructions that cause the nanotechnology fabrication device 40 to form a template region on a substrate such that the template region is arranged in accordance with the template array arrangement 104.

Figure 6B:
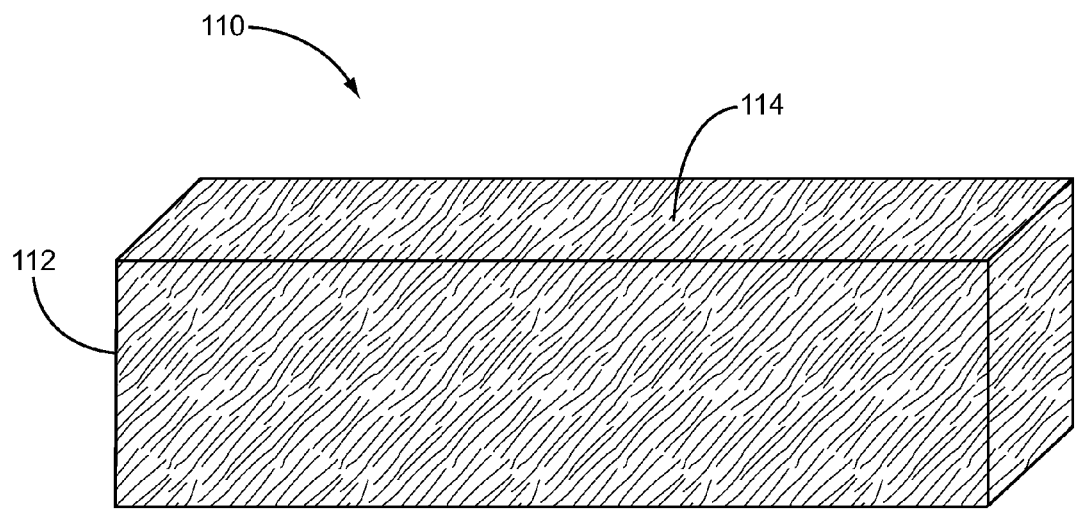

FIG. 6B illustrates one embodiment of a substrate 110 prior to the formation of a template region. The substrate 110 has a substrate body 112 and a surface 114. The substrate body 112 may be formed from a non-conductive material or a semiconductor material. With regard to non-conductive materials, the substrate body 112 may be formed from laminates, insulating materials, dielectric materials, ceramic, glass, fibers, and/or the like. In this embodiment, the substrate body 112 is formed from a wafer and/or doped layers of a suitable semiconductor material. For example, the semiconductor material may be silicon (Si), silicon germanium (SiGe), gallium arsenide (GaAs), indium phosphorus (InP), and/or the like. Typical dopants that may be used to dope the semiconductor layers in the substrate body 112 are gallium (Ga), arsenic (As), silicon (Si), tellurium (Te), zinc (Zn), sulfur (S), boron (B), phosphorus (P), aluminum gallium arsenide (AlGaAs), indium gallium arsenide (InGaAs), and/or the like. Metallic layers may be formed on top of, within, and/or on a bottom of the substrate body 112 to provide terminals, traces, coils, connections, passive impedance elements, active semiconductor components, and/or the like.

The substrate body 112 defines the surface 114. The template region is formed at the surface 114 of the substrate body 112. To form the template region at the surface 114, the central processing core 24 executes computer-executable instructions that result in control output to the nanotechnology fabrication device 40 (FIG. 2). Based on the template array arrangement 104 described with respect to FIG. 6A, the central processing core 24 executes computer-executable instructions that cause the nanotechnology fabrication device 40 to form a template region at the surface 114. Accordingly, the nanotechnology fabrication device 40 performs the sub-procedures required to form the template region under the control of the central processing core 24 as specified by the computer-executable instructions being executed.

Figure 6C:
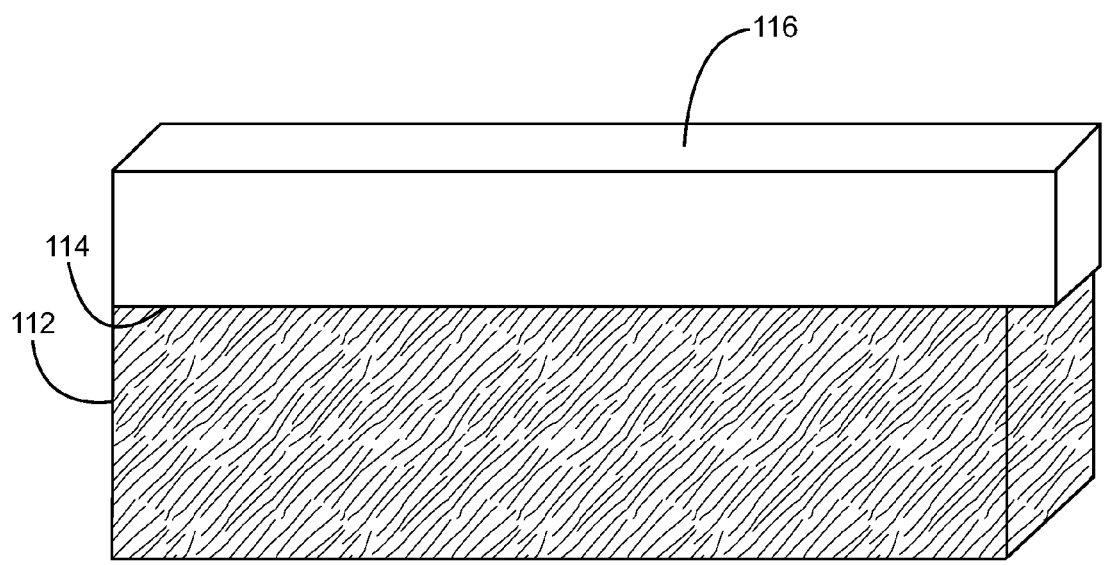

FIG. 6C illustrates the substrate 110 after the nanotechnology fabrication device 40 spin-coats a resist layer 116 on the surface 114 of the substrate body 112. In one embodiment, the resist layer 116 is an HSQ layer that is spin-coated to have a thickness of around 40 nm. Using electron beam lithography on the resist layer 116, the template structures are formed from the resist layer 116. In particular, the template array arrangement 104 (FIG. 6A) is used, so that a template region is formed through electron beam lithography in accordance with the template array arrangement 104.

Figure 6D:
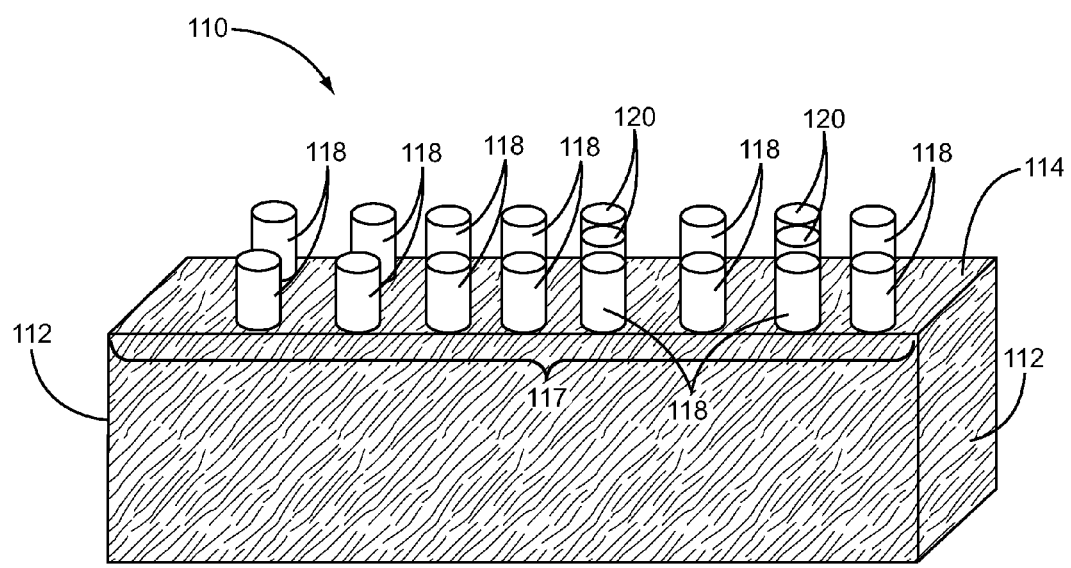

FIG. 6D illustrates one embodiment of a template region 117 formed at the surface 114 of the substrate body 112. The template region 117 includes template structures 118 that are of a first type and template structures 120 that are of a second type. In this embodiment, the template structures 118 are single dot post template structures. Additionally, the template structures 120 are double dot post template structures. The template structures 118 extend out from the surface 114 and are thus oriented in a direction normal to the surface 114. The same is true for each dot post of the template structures 120. The template region array in the template region 117 is arranged in accordance with the template array arrangement 104 shown in FIG. 6A. If we assume that there were no manufacturing errors, the template structures 118 correspond bijectively with the template structure representations 87 of the template array arrangement 104 in FIG. 6A, while the template structures 120 correspond bijectively with the template structure representations C1 and/or C2 of the template array arrangement 104 in FIG. 6A.

Figure 6E:
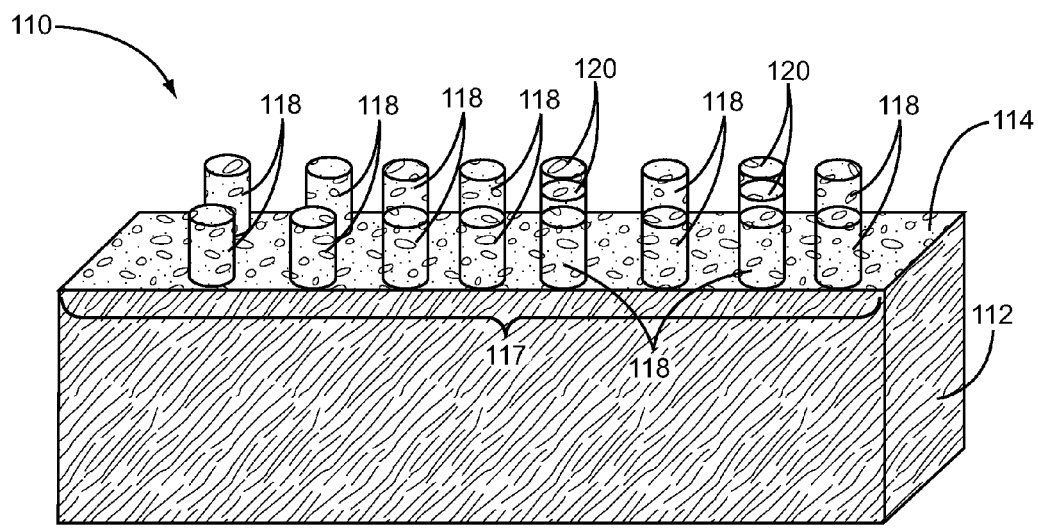

Referring now to FIG. 6E, the template region 117, including the surface 114 and the template structures 118 and 120, is functionalized. In one embodiment, the central processing core 24 executes computer-executable instructions that generate control outputs that operate a homopolymer brush within the nanotechnology fabrication device 40 (FIG. 2). The homopolymer brush spin-casts hydroxyl terminated PDMS on the template region 117. In this manner, the template region 117 is functionalized. Solvent vapor annealing may then be performed with a mixture of toluene and heptane. After the solvent vapor annealing, a rapid quench may be performed to stabilize the morphology of the functionalizing layer on the template region 117.

Figure 6F:
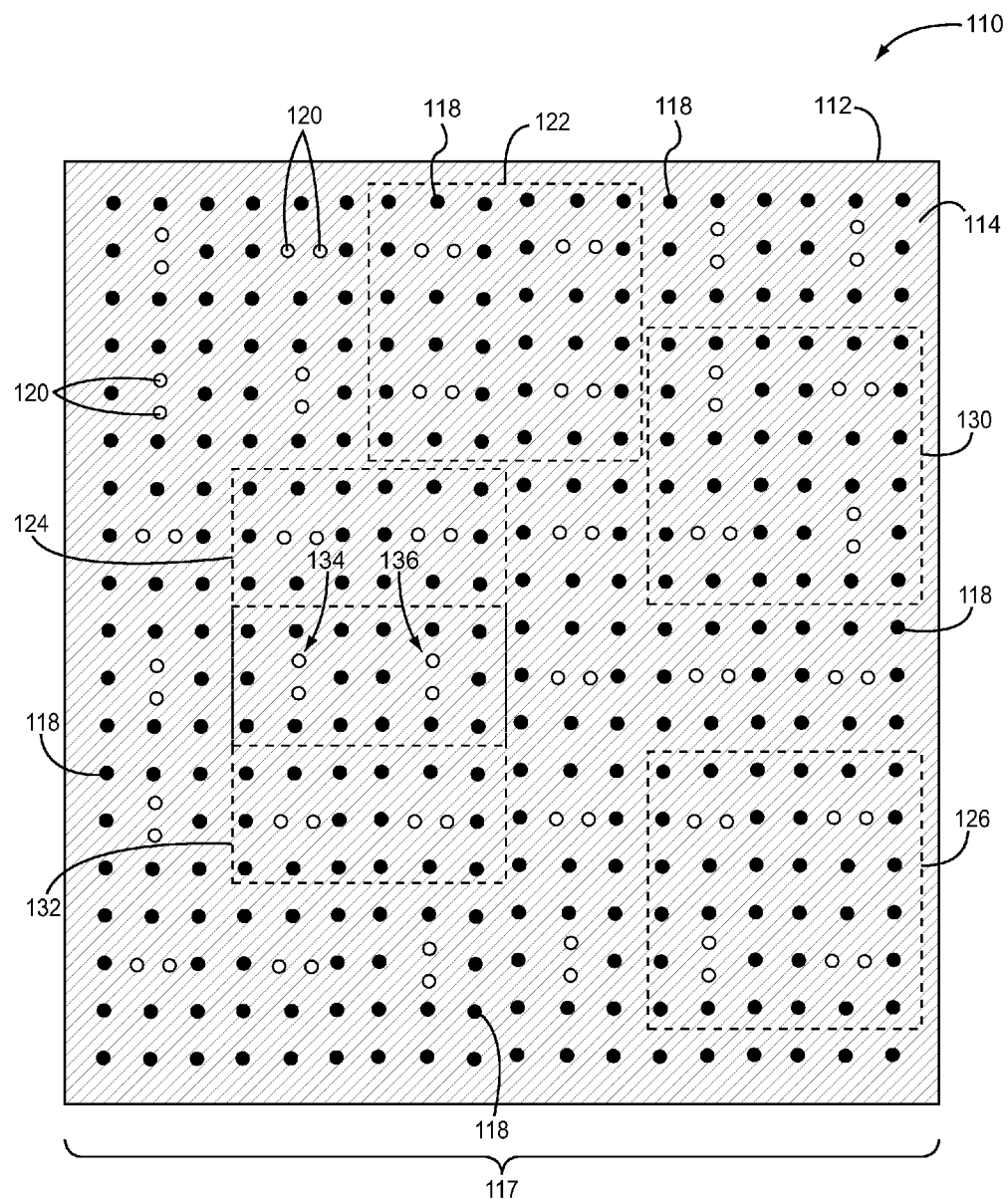

FIG. 6F is a top view of the template region 117 after functionalization and annealing. The template region 117 is arranged in accordance with the template array arrangement 104 shown in FIG. 6A. The template region array has arrays arranged in accordance with the array arrangements 94(1), 94(2), 94(3), 94(4) shown in FIGS. 5A-5D. More particularly, there are arrays of the template structures 118, 120 that are arranged in accordance with each array arrangement 94(1), 94(2), 94(3), 94(4) in the set of array arrangements 94(1), 94(2), 94(3), 94(4). More particularly, each of the arrays is arranged in accordance with an array arrangement in the set of array arrangements 94(1), 94(2), 94(3), 94(4) such that the set of array arrangements 94(1), 94(2), 94(3), 94(4) corresponds surjectively onto the arrays in the template region 117. Thus, in this embodiment, one or more arrays is arranged in accordance with a particular array arrangement 94(1), 94(2), 94(3), 94(4) for every array arrangement 94(1), 94(2), 94(3), 94(4) in the set of array arrangements 94(1), 94(2), 94(3), 94(4).

An array 122 is provided as a sub-array within the template region 117. The array 122 shown in FIG. 6F is arranged in accordance with the array arrangement 94(1) shown in FIG. 5A. As mentioned above, the array arrangement 94(1) is an unoriented array arrangement and the array 122 has an arrangement orientation with respect to the array arrangement 94(1). Thus, an orientation parameter or orientation parameters are provided along with the array arrangement 94(1) to describe the arrangement orientation of the array 122. In this embodiment, the orientation parameter or orientation parameters define the arrangement orientation with a rotation of 90°.

An array 124 is also included as a sub-array within the template region 117. The array 124 is arranged in accordance with the array arrangement 94(2) shown in FIG. 5B. As mentioned above, the array arrangement 94(2) is an unoriented array arrangement and the array 124 has an arrangement orientation with respect to the array arrangement 94(2). Thus, an orientation parameter or orientation parameters are provided along with the array arrangement 94(2) to describe the arrangement orientation of the array 124. In this embodiment, the orientation parameter or orientation parameters define the arrangement orientation to be at reference and thus aligned with the array arrangement 94(2).

An array 126 is also included as a sub-array within the template region 117. The array 126 is arranged in accordance with the array arrangement 94(3) shown in FIG. 5C. As mentioned above, the array arrangement 94(3) is an unoriented array arrangement and the array 126 has an arrangement orientation with respect to the array arrangement 94(3). Thus, an orientation parameter or orientation parameters are provided along with the array arrangement 94(3) to describe the arrangement orientation of the array 126. In this embodiment, the orientation parameter or orientation parameters define the arrangement orientation with a mirrored symmetry about the Y axis and a rotation of −90°.

An array 130 is also included as a sub-array within the template region 117. The array 130 is arranged in accordance with the array arrangement 94(4) shown in FIG. 5D. As mentioned above, the array arrangement 94(4) is an unoriented array arrangement and the array 130 has an arrangement orientation with respect to the array arrangement 94(4). Thus, an orientation parameter or orientation parameters are provided along with the array arrangement 94(4) to describe the arrangement orientation of the array 130. In this embodiment, the orientation parameter or orientation parameters define the arrangement orientation with a mirrored symmetry about the X axis.

For the purpose of maintaining information regarding the arrays in the template region 117, the central processing core 24 may execute computer-executable instructions that only consider mutually exclusive arrays. However, the central processing core 24 may execute computer-executable instructions that maintain information for non-mutually exclusive arrays in the template region 117.

For example, an array 132 is included as a sub-array within the template region 117. The array 124 and the array 132 are not mutually exclusive, since both share a pair of degenerate unit cells 134, 136. The array 132 is arranged in accordance with the array arrangement 94(2) shown in FIG. 5B. However, the array has an oriented array arrangement with an arrangement orientation relative to the array arrangement 94(2). Thus, an orientation parameter or orientation parameters are provided along with the array arrangement 94(2) to describe the arrangement orientation of the oriented array arrangement for the array 132. In this embodiment, the orientation parameter or orientation parameters define the arrangement orientation with a mirrored symmetry about the X axis.

FIGS. 7A-7T are related to sub-procedures for performing one embodiment of the procedure 1004 described above with regard to FIG. 3. As described above, in procedure 1004, the central processing core 24 executes computer-executable instructions that cause the central processing core 24 to map the set of self-assembly pattern arrangements surjectively onto the set of array arrangements based on self-assembly patterns empirically observed to have been formed by the self-assembly material as a result of the arrays.

To implement the procedure 1004, as shown in FIG. 7A, the central processing core 24 executes computer-executable instructions that cause the nanotechnology fabrication device 40 (FIG. 2) to spin-coat a self-assembling material 140 on the template region 117 of the substrate 110 after the template region 117 has been functionalized (as described with regard to FIG. 6E). In this embodiment, the self-assembling material 140 is a coblock polymer. For example, the self-assembling material 140 shown in FIG. 7A is PS-b-PDMS. Self-assembly of the self-assembling material 140 is then triggered by the nanotechnology fabrication device 140 so that the self-assembling material self-assembles on the template region 117.

FIG. 7B illustrates the template region 117 after the self-assembling material 140 has self-assembled to form cylinders 142. The cylinders 142 formed from the self-assembling material 140 (shown in FIG. 7A) are a result of the arrangements of the template structures 118 and 120. For example, the array 122 results in a portion of the self-assembling material 140 self-assembling into the cylinders 142, whose self-assembly pattern is based on the geometrical and spatial characteristics of the template structures 118 and 120 in the array 122. The same can be said for the array 124, the array 126, the array 130, and the array 132. The double dot post template structures 120 determine changes in a self-assembly orientation of the cylinders 142, and thus the four degenerate unit cells within the arrays (such as the array 122, 124, 126, 130, 132) in the template region 117 result in self-assembly patterns depending on the geometrical and spatial characteristics of the template structures 118 and 120.

FIG. 7C specifically illustrates the array 122 from the template region 117 shown in FIG. 7B, along with a self-assembly pattern resulting from the array 122. In this particular embodiment, the self-assembly pattern is formed by the cylinders 142. Changes in self-assembly orientation are determined by the template structures 120 (i.e., the double dot post template structures) in the array 122. As such, the self-assembly pattern formed by the cylinders 142 is determined by the template structures 120 in the array 122.

FIG. 7D specifically illustrates the array 124 from the template region 117 shown in FIG. 7B, along with a self-assembly pattern resulting from the array 124. In this particular embodiment, the self-assembly pattern is formed by the cylinders 142. Changes in self-assembly orientation are determined by the template structures 120 (i.e., the double dot post template structures) in the array 124. As such, the self-assembly pattern formed by the cylinders 142 is determined by the template structures 120 in the array 124.

FIG. 7E specifically illustrates the array 126 from the template region 117 shown in FIG. 7B, along with a self-assembly pattern resulting from the array 126. In this particular embodiment, the self-assembly pattern is formed by the cylinders 142. Changes in self-assembly orientation are determined by the template structures 120 (i.e., the double dot post template structures) in the array 126. As such, the self-assembly pattern formed by the cylinders 142 is determined by the template structures 120 in the array 126.

FIG. 7F specifically illustrates the array 130 from the template region 117 shown in FIG. 7B, along with a self-assembly pattern resulting from the array 130. In this particular embodiment, the self-assembly pattern is formed by the cylinders 142. Changes in self-assembly orientation are determined by the template structures 120 (i.e., the double dot post template structures) in the array 130. As such, the self-assembly pattern formed by the cylinders 142 is determined by the template structures 120 in the array 130.

The advantage of utilizing degenerate unit cells is demonstrated in FIGS. 7C-7F. If degenerate unit cells were not utilized, the template structure 120 may have unlocalized effects on self-assembly in other parts of the template region 117 (shown in FIG. 6D). However, using degenerate unit cells allows changes in the orientation of the cylinders 142 to be localized. Accordingly, the self-assembly patterns can be compartmentalized as being determined solely by the template structures 120 within the arrays 122, 124, 126, 130. The central processing core 24 is operable to utilize the scanning electron microscope and empirically observe the self-assembly patterns. This may result in measurement data describing the geometric and spatial features of the self-assembly patterns shown in FIGS. 7C-7F. The central processing core 24 may then generate self-assembly pattern arrangements that represent arrangements of the self-assembly patterns resulting from the arrays in the template region 117 using the measurement data.

FIGS. 7G-7J are each a visual representation of the self-assembly pattern arrangements generated from the self-assembly patterns resulting from the arrays 122, 124, 126, 130. FIG. 7G is a self-assembly pattern arrangement 150 generated as a result of empirically observing the self-assembly pattern resulting from the array 122 in FIG. 7C. The self-assembly pattern arrangement 150 is an oriented self-assembly pattern arrangement, since the array 122 has the arrangement orientation with the rotation of 90° with respect to the array arrangement 94(1). FIG. 7H is a self-assembly pattern arrangement 152 generated as a result of empirically observing the self-assembly pattern resulting from the array 124 in FIG. 7D. The self-assembly pattern arrangement 152 is an oriented self-assembly pattern arrangement, since the array 124 has the arrangement orientation at reference with respect to the array arrangement 94(2). FIG. 7I is a self-assembly pattern arrangement 154 generated as a result of empirically observing the self-assembly pattern resulting from the array 126 in FIG. 7E. The self-assembly pattern arrangement 154 is an oriented self-assembly pattern arrangement, since the array 126 has the arrangement orientation with the mirror symmetry flipped about the X axis and the rotation of −90° with respect to the array arrangement 94(3). FIG. 7J is a self-assembly pattern arrangement 156 generated as a result of empirically observing the self-assembly pattern resulting from the array 130 in FIG. 7F. The self-assembly pattern arrangement 156 is an oriented self-assembly pattern arrangement, since the array 124 has the arrangement orientation with the mirror symmetry flipped about the X-axis with respect to the array arrangement 94(4).

FIG. 7K illustrates the array 122 and the self-assembly pattern resulting from the array 122 at reference, and thus aligned with the unoriented array arrangement 94(1). Accordingly, the self-assembly pattern in FIG. 7K is illustrated as an unoriented self-assembly pattern. FIG. 7L illustrates the array 124 and the self-assembly pattern resulting from the array 124 at reference, and thus aligned with the unoriented array arrangement 94(2). Accordingly, the self-assembly pattern in FIG. 7L is illustrated as an unoriented self-assembly pattern. FIG. 7M illustrates the array 126 and the self-assembly pattern resulting from the array 126 at reference, and thus aligned with the unoriented array arrangement 94(3). Accordingly, the self-assembly pattern in FIG. 7M is illustrated as an unoriented self-assembly pattern. FIG. 7N illustrates the array 130 and the self-assembly pattern resulting from the array 130 at reference, and thus aligned with the unoriented array arrangement 94(4). Accordingly, the self-assembly pattern in FIG. 7N is illustrated as an unoriented self-assembly pattern.

FIGS. 7O-7R are visual representations of unoriented self-assembly pattern arrangements 158, 160, 162, and 164, which are generated from the self-assembly pattern arrangements 150, 152, 154, and 156, respectively. The unoriented self-assembly pattern arrangements 158, 160, 162, 164 thus describe arrangements of the self-assembly patterns resulting from the arrays 122, 124, 126, 130 unoriented as shown in FIGS. 7K-7N, respectively. More specifically, FIG. 7O illustrates the unoriented self-assembly pattern arrangement 158 generated by the central processing core 24 from the self-assembly pattern arrangement 150 shown in FIG. 7G. The unoriented self-assembly pattern arrangement 158 is the same as the self-assembly pattern arrangement 150, except the unoriented self-assembly pattern arrangement 158 is not oriented, and thus appears in FIG. 7O as if aligned at reference. The unoriented self-assembly pattern arrangement 158 is generated from the self-assembly pattern arrangement 150 based on the orientation parameter(s) of the array 122. More specifically, an inverted transformation can be used on the self-assembly pattern arrangement 150, calculated in accordance with the orientation parameter(s) of the array 122, which generates the unoriented self-assembly pattern arrangement 158 at reference.

FIG. 7P illustrates the unoriented self-assembly pattern arrangement 160 generated by the central processing core 24 from the self-assembly pattern arrangement 152 shown in FIG. 7H. The unoriented self-assembly pattern arrangement 160 is the same as the self-assembly pattern arrangement 152, except the unoriented self-assembly pattern arrangement 160 is not oriented, and thus appears in FIG. 7P aligned at reference. The unoriented self-assembly pattern arrangement 160 is generated from the self-assembly pattern arrangement 152 based on the orientation parameter(s) of the array 124. More specifically, an inverted transformation calculated in accordance with the orientation parameter(s) of the array 124 can be used on the self-assembly pattern arrangement 152 to generate the unoriented self-assembly pattern arrangement 160 at reference.

FIG. 7Q illustrates the unoriented self-assembly pattern arrangement 162 generated by the central processing core 24 from the self-assembly pattern arrangement 154 shown in FIG. 7I. The unoriented self-assembly pattern arrangement 162 is the same as the self-assembly pattern arrangement 154, except the unoriented self-assembly pattern arrangement 162 is not oriented, and thus appears in FIG. 7Q aligned at reference. The unoriented self-assembly pattern arrangement 162 is generated from the self-assembly pattern arrangement 154 based on the orientation parameter(s) of the array 126. More specifically, an inverted transformation calculated in accordance with the orientation parameter(s) of the array 126 can be used on the self-assembly pattern arrangement 154 to generate the unoriented self-assembly pattern arrangement 162 at reference.

FIG. 7R illustrates the unoriented self-assembly pattern arrangement 164 generated by the central processing core 24 from the self-assembling pattern arrangement 156 shown in FIG. 7J. The unoriented self-assembly pattern arrangement 164 is the same as the self-assembly pattern arrangement 156, except the unoriented self-assembly pattern arrangement 164 is not oriented, and thus appears in FIG. 7R aligned at reference. The unoriented self-assembly pattern arrangement 164 is generated from the self-assembly pattern arrangement 156 based on the orientation parameter(s) of the array 130. More specifically, an inverted transformation calculated in accordance with the orientation parameter(s) of the array 130 can be used on the self-assembly pattern arrangement 156 to generate the unoriented self-assembly pattern arrangement 164 at reference.

FIG. 7S is a visual illustration of the central processing core 24 mapping a set 168 of the unoriented self-assembly pattern arrangements 158, 160, 162, and 164 surjectively onto a set 170 of the array arrangements 94(1), 94(2), 94(3), 94(4). Accordingly, since the array 122 (shown in FIGS. 7C and 7K) was arranged in accordance with the array arrangement 94(1), and since the array 122 resulted in a self-assembly pattern arranged in accordance with the unoriented self-assembly pattern arrangement 158, the unoriented self-assembly pattern arrangement 158 is mapped to the array arrangement 94(1). Since the array 124 (shown in FIGS. 7D and 7L) was arranged in accordance with the array arrangement 94(2), and since the array 124 resulted in a self-assembly pattern arranged in accordance with the unoriented self-assembly pattern arrangement 160, the central processing core 24 maps the unoriented self-assembly pattern arrangement 160 to the array arrangement 94(2). Since the array 126 (shown in FIGS. 7E and 7M) is arranged in accordance with the array arrangement 94(3), and since the array 126 resulted in a self-assembly pattern arranged in accordance with the unoriented self-assembly pattern arrangement 162, the central processing core 24 maps the unoriented self-assembly pattern arrangement 162 to the array arrangement 94(3). Finally, since the array 130 (shown in FIGS. 7F and 7N) was arranged in accordance with the array arrangement 94(4), and since the array 130 resulted in a self-assembly pattern arranged in accordance with the unoriented self-assembly pattern arrangement 164, the central processing core 24 maps the unoriented self-assembly pattern arrangement 164 to the array arrangement 94(4).

For the sake of clarity, it has been presumed that the array 122 and the self-assembly pattern resulting from the array 122 are the only sampling points used to map the unoriented self-assembly pattern arrangement 158 to the array arrangement 94(1). Similarly, for the sake of clarity, it has been presumed that the array 124 and the empirically observed self-assembly pattern resulting from the array 124 are the only sampling points used to map the unoriented self-assembly pattern arrangement 160 to the array arrangement 94(2). Also, for the sake of clarity, it has been presumed that the array 126 and the empirically observed self-assembly pattern resulting from the array 126 are the only sampling points utilized to map the self-assembly pattern arrangement 162 to the array arrangement 94(3). Finally, also for the sake of clarity, it has been presumed that the array 130 and the empirically observed self-assembly pattern resulting from the array 130 are the only sampling points used to map the unoriented self-assembly pattern arrangement 164 to the array arrangement 94(4). This may or may not be the case. In fact, some or all of the arrays arranged in accordance with the array arrangement 94(1), some or all of the arrays arranged in accordance with the array arrangement 94(2), some or all of the arrays arranged in accordance with the array arrangement 94(3), and some or all of the arrays arranged in accordance with the array arrangement 94(4), along with some or all of the empirically observed self-assembly patterns for the arrays in accordance with the array arrangement 94(1), some or all of the empirically observed self-assembly patterns for the arrays in accordance with the array arrangement 94(2), some or all of the empirically observed self-assembly patterns for the arrays in accordance with the array arrangement 94(3), and some or all of the empirically observed self-assembly patterns for the arrays in accordance with the array arrangement 94(4) may be utilized to map the set 168 of the unoriented self-assembly pattern arrangements 158, 160, 162, 164 surjectively onto the set 170 of the array arrangements 94(1), 94(2), 94(3), 94(4).

In some cases, the mapping may remain identical to the mapping visually described in FIG. 7S. For example, for every array (such as the array 122) arranged in accordance with the array arrangement 94(1), the central processing core 24, utilizing the nanotechnology fabrication device 40, may empirically observe that the self-assembly patterns resulting from these arrays are all arranged in accordance with the unoriented self-assembly pattern arrangement 158. For all of the arrays (such as the array 124) arranged in accordance with the array arrangement 94(2), the central processing core 24, utilizing the nanotechnology fabrication device 40, may empirically observe that the self-assembly patterns resulting from these arrays are all arranged in accordance with the self-assembly pattern arrangement 160. In addition, for all of the arrays (such as the array 126) arranged in accordance with the array arrangement 94(3), the central processing core 24, utilizing the nanotechnology fabrication device 40, may empirically observe that the self-assembly patterns resulting from these arrays are all arranged in accordance with the self-assembly pattern arrangement 162. Finally, for all of the arrays (such as the array 130) arranged in accordance with the array arrangement 94(4), the central processing core 24, utilizing the nanotechnology fabrication device 40, may empirically observe that the self-assembly patterns resulting from these arrays are all arranged in accordance with the self-assembly pattern arrangement 164. As such, all of the sampling points will reinforce the mapping visually illustrated in FIG. 7S.

In this embodiment, the set 168 of the self-assembly pattern arrangements 158, 160, 162, 164 is also injectively mapped to the set 170 of the array arrangements 94(1), 94(2), 94(3), 94(4). As such, this further means that the set 168 of the self-assembly pattern arrangements 158, 160, 162, 164 is bijectively mapped to the set 170 of the array arrangements 94(1), 94(2), 94(3), 94(4). The mapping performed by the central processing core 24 may result in a mapping output.

FIG. 8 is a visual representation of one embodiment of a mapping output 172. The mapping output 172 may be a data structure. The mapping output 172 includes the array arrangements 94(1), 94(2), 94(3), and 94(4). In addition, the mapping output 172 includes the self-assembly pattern arrangements 158, 160, 162, and 164. The mapping output 172 maps the unoriented self-assembly pattern arrangement 158 to the array arrangement 94(1). The mapping output 172 maps the self-assembly pattern arrangement 160 to the array arrangement 94(2). The mapping output 172 maps the self-assembly pattern arrangement 162 to the array arrangement 94(3). The mapping output 172 maps the self-assembly pattern arrangement 164 to the array arrangement 94(4).

FIG. 9 illustrates various arrays 174, 176, 178, 180, and 182. Each of the arrays is arranged in accordance with the array arrangement 94(3) (shown in FIG. 5C). Also shown are the self-assembly patterns created by cylinders as a result of self-assembly with regard to each of the arrays 174, 176, 178, 180, 182. The self-assembly pattern resulting from the array 174 is arranged in accordance with the self-assembly pattern arrangement 162, which is visually depicted in FIG. 9 for the sake of clarity. However, although the arrays 176, 178, 180, and 182 are all arranged in accordance with the array arrangement 94(3), the self-assembly patterns resulting from each of the arrays 176, 178, 180, and 182 are arranged in accordance with different self-assembly pattern arrangements 184, 186, 188, and 190 (which are visually illustrated for the sake of clarity), respectively. FIG. 9 also illustrates a graph with a percentage tally line 192 and a free energy difference line 194. Based on the empirical observations of the central processing core 24 with the nanotechnology fabrication device 40 for a particular substrate, self-assembly patterns arranged in accordance with the self-assembly pattern arrangement 162 occurred 60% of the time, self-assembly patterns arranged in accordance with the self-assembly pattern arrangement 184 occurred 13% of the time, self-assembly patterns arranged in accordance with the self-assembly pattern arrangement 186 occurred 10% of the time, self-assembly patterns arranged in accordance with the self-assembly pattern arrangement 188 occurred 7% of the time, and self-assembly patterns arranged in accordance with the self-assembly pattern arrangement 190 occurred 6% of the time. The free energy difference line 194 demonstrates that the particular arrangement for the self-assembly patterns was at least correlated with the free energy difference.

FIG. 10 visually illustrates the mapping of the set 168 to the set 170 given the empirical observations described in FIG. 9. The unoriented self-assembly pattern arrangements 158, 160, and 164 are mapped to the array arrangements 94(1), 94(2), 94(4) in the same manner described above with respect to FIG. 7S. With regard to the array arrangement 94(3), the central processing core 24 only includes the unoriented self-assembly pattern arrangement 162 in the set 168, since the percentage tally line 192 (FIG. 9) indicates that the self-assembly patterns that were arranged in accordance with the unoriented self-assembly pattern arrangement 162 have the highest percentage tally. The self-assembly pattern arrangements 184, 186, 188, and 190 are all excluded from the set 168, and are thus not mapped. The central processing core 24 only maps the unoriented self-assembly pattern arrangement 162 to the array arrangement 94(3). Note that the mapping illustrated in FIG. 10 is surjective and injective, and thus, bijective.

FIG. 11 illustrates another embodiment for mapping in light of the empirical observations described above with regard to FIG. 9. In this embodiment, a set 196 of the self-assembly pattern arrangements 158, 160, 162, 164, 184, 186, 188, and 190 are mapped surjectively by the central processing core 24 onto the set 170 of the array arrangements 94(1), 94(2), 94(3), and 94(4). The mapping of the unoriented self-assembly pattern arrangements 158, 160, and 164 to the array arrangements 94(1), 94(2), and 94(4) is the same as described above with respect to FIG. 7S. Furthermore, in this embodiment, each of the self-assembly pattern arrangements 162, 184, 186, 188, and 190 is mapped to the array arrangement 94(3). Thus, while the mapping of the set 196 is surjective onto the set 170, the mapping of the set 196 to the set 170 is not injective. This is because more than one of the self-assembly pattern arrangements 162, 184, 186, 188, and 190 map to the same array arrangement 94(3) in the set 170. The self-assembly pattern arrangements 162, 184, 186, 188, and 190 are grouped in a subset 198. Which self-assembly pattern arrangement 162, 184, 186, 188, 190 in the subset 198 is selected when the array arrangement 94(3) is utilized in a design application may depend on empirical data during fabrication. For example, the free energy difference data may have a free energy difference value that is utilized to select a particular member of the subset 198.

FIG. 12 visually illustrates one embodiment of a target pattern arrangement 200 that defines a target pattern. For example, the target pattern arrangement 200 may represent a wiring configuration to connect semiconductor device components. It would thus be desirable for the self-assembling material, such as, for example, PS-b-PDMS, to self-assemble in accordance with the target pattern arrangement 200 to provide the desired wiring for semiconductor devices built in a substrate (such as the substrate 110 shown in FIG. 6B).

FIG. 13 illustrates a template region representation 202 generated based on the mapping described in FIG. 7S and the mapping output 172 described with regard to FIG. 8. As shown in FIG. 13, the template region representation 202 is configured so that self-assembling material on a template region arranged in accordance with the template region representation 202 results in cylinders arranged in accordance with the target pattern arrangement 200. In one embodiment, the target pattern arrangement 200 is treated as a path from the set 168 of the unoriented self-assembly pattern arrangements 158, 160, 162, and 164 to the set 170 of the array arrangements 94(1), 94(2), 94(3), 94(4). The path defined by the target pattern arrangement 200 determines a group of the unoriented self-assembly pattern arrangements 158, 160, 162, 164 and self-assembly orientations that match the target pattern arrangement 200. In this manner, array representations with the array arrangements 94(1), 94(2), 94(3), 94(4) are also oriented in accordance with the self-assembly orientation defined by the target pattern arrangement 200.

Thus, using the target pattern arrangement 200, the central processing core 24 iterates through the unoriented self-assembly pattern arrangements 158, 160, 162, 164, as well as through different corresponding self-assembly orientations until a match to a section represented by the target pattern arrangement 200 is found. An array representation is then provided in the template region representation 202 arranged in accordance with the array arrangement 94(1), 94(2), 94(3), or 94(4) in the set 170 that corresponds to the unoriented self-assembly pattern arrangements 158, 160, 162, 164 in the set 168 that matches the section of the target pattern arrangement 200. Furthermore, the array representation has an orientation parameter or orientation parameters that define an arrangement orientation in accordance with the corresponding self-assembly arrangement orientation used in order for the unoriented self-assembly pattern arrangement 158, 160, 162, 164 to match the section of the target pattern arrangement 200. The central processing core 24 may execute computer-executable instructions that iterate through all the sections of the target pattern arrangement 200 until all the array representations that match each section of the target pattern arrangement 200 are provided in the template region representation 202.

FIG. 14 illustrates a template region 204 formed so as to be arranged in accordance with the template region representation 202 shown in FIG. 13. The template region 204 is shown after self-assembly of a self-assembling material on the template region 204. As predicted, cylinders 206 have self-assembled so as to be arranged in accordance with the target pattern arrangement 200 described above with regard to FIGS. 12 and 13.

Those skilled in the art will recognize improvements and modifications to the preferred embodiments of the present disclosure. All such improvements and modifications are considered within the scope of the concepts disclosed herein and the claims that follow.

What is claimed is:

1. A method of providing standardized topographical configurations for template regions that orient self-assembly, comprising:
   selecting a set of array arrangements by generating the set of array arrangements, wherein each of the array arrangements in the set of array arrangements is a different combination of degenerate unit cells, the degenerate unit cells comprising an X-oriented unit cell and a Y-oriented degenerate unit cell and wherein:
      the X-oriented degenerate unit cell comprises a central double dot template structure representation oriented along an X-axis and single dot template structure representations that surround the central double dot template structure representation in the X-oriented degenerate unit cell;
      the Y-oriented degenerate unit cell comprises a central double dot template structure representation oriented along a Y-axis and single dot template structure representations that surround the central double dot template structure representation in the Y-oriented degenerate unit cell;
   forming arrays of template structures on at least one substrate, wherein each of the arrays is arranged in accordance with an array arrangement in the set of array arrangements such that the arrays correspond surjectively onto the set of array arrangements; and
   mapping a set of self-assembly pattern arrangements surjectively onto the set of array arrangements with a central processing core and based on self-assembly patterns empirically observed to have been formed by a self-assembling material as a result of the arrays.

2. The method of claim 1 wherein the self-assembling material is a block copolymer.

3. The method of claim 2 wherein the block copolymer is a diblock copolymer.

4. The method of claim 3 wherein the diblock copolymer is polystyrene-b-polydimethylsiloxane (PS-b-PDMS).

5. The method of claim 1 wherein the set of array arrangements comprises a set of unoriented array arrangements.

6. The method of claim 1 wherein forming the arrays of template structures on the at least one substrate comprises:
   spin-coating a resist layer on each of the at least one substrate; and
   forming at least one template region from the resist layer on each of the at least one substrate, wherein the at least one template region includes the arrays of template structures.

7. The method of claim 1 wherein forming the arrays of template structures on the at least one substrate further comprises functionalizing the arrays of template structures.

8. The method of claim 1 wherein mapping the set of self-assembly pattern arrangements surjectively onto the set of array arrangements comprises empirically observing the self-assembly patterns formed by the self-assembling material as a result of the arrays.

9. The method of claim 1 wherein mapping the set of self-assembly pattern arrangements surjectively onto the set of array arrangements comprises:
   providing the self-assembling material on each of the arrays;
   triggering self-assembly of the self-assembling material so that the self-assembling material forms the self-assembly patterns on each of the arrays;
   generating the set of self-assembly pattern arrangements describing arrangements of the self-assembly patterns; and
   mapping the set of self-assembly pattern arrangements surjectively onto the set of array arrangements.

10. The method of claim 1 wherein mapping the set of self-assembly pattern arrangements surjectively onto the set of array arrangements comprises generating a mapping output that maps the set of self-assembly pattern arrangements onto the set of array arrangements.

11. The method of claim 1 wherein a subset of self-assembly pattern arrangements is mapped to one of the array arrangements in the set of array arrangements.

12. A computer system, comprising:
   a central processing core;
   memory that stores computer-executable instructions; and
   a nanotechnology fabrication device controllable by the central processing core;
   wherein the central processing core is configured to execute the computer-executable instructions, which cause the central processing core to:
      select a set of array arrangements by generating the set of array arrangements, wherein each of the array arrangements in the set of array arrangements is a different combination of degenerate unit cells, the degenerate unit cells comprising an X-oriented unit cell and a Y-oriented degenerate unit cell and wherein:
         the X-oriented degenerate unit cell comprises a central double dot template structure representation oriented along an X-axis and single dot template structure representations that surround the central double dot template structure representation in the X-oriented degenerate unit cell;
         the Y-oriented degenerate unit cell comprises a central double dot template structure representation oriented along a Y-axis and single dot template structure representations that surround the central double dot template structure representation in the Y-oriented degenerate unit cell;
      form arrays of template structures on at least one substrate by controlling the nanotechnology fabrication device, wherein each of the arrays is arranged in accordance with an array arrangement in the set of array arrangements such that the arrays correspond surjectively onto the set of array arrangements; and map a set of self-assembly pattern arrangements surjectively onto the set of array arrangements based on self-assembly patterns empirically observed to have been formed by a self-assembling material as a result of the arrays.

13. The computer system of claim 12 wherein the self-assembling material is a block copolymer.

14. The computer system of claim 12 wherein the central processing core selects the array arrangements by:
generating the set of array arrangements, wherein each of the array arrangements in the set of array arrangements is a different combination of degenerate unit cells.

15. The computer system of claim 12 wherein the central processing core maps the set of self-assembly pattern arrangements surjectively onto the set of array arrangements by:
providing the self-assembling material on each of the arrays;
triggering self-assembly of the self-assembling material so that the self-assembling material forms the self-assembly patterns on each of the arrays;
generating the set of self-assembly pattern arrangements describing arrangements of the self-assembly patterns; and
mapping the set of self-assembly pattern arrangements surjectively onto the set of array arrangements.

16. The computer system of claim 12 wherein mapping the set of self-assembly pattern arrangements surjectively onto the set of array arrangements results in the central processing core generating a mapping output that maps the set of self-assembly pattern arrangements onto the set of array arrangements.

17. A method of providing standardized topographical configurations for template regions that orient self-assembly, comprising:
selecting a set of array arrangements by generating the set of array arrangements, wherein each of the array arrangements in the set of array arrangements is a different combination of degenerate unit cells and wherein each of the array arrangements in the set of array arrangements has a first quadrant degenerate unit cell, a second quadrant degenerate unit cell, a third quadrant degenerate unit cell, and a fourth quadrant degenerate unit cell;
forming arrays of template structures on at least one substrate, wherein each of the arrays is arranged in accordance with an array arrangement in the set of array arrangements such that the arrays correspond surjectively onto the set of array arrangements; and
mapping a set of self-assembly pattern arrangements surjectively onto the set of array arrangements with a central processing core and based on self-assembly patterns empirically observed to have been formed by a self-assembling material as a result of the arrays.

18. A method of providing standardized topographical configurations for template regions that orient self-assembly, comprising:
selecting a set of array arrangements by generating the set of array arrangements, wherein each of the array arrangements in the set of array arrangements is a different combination of degenerate unit cells and wherein the set of self-assembly pattern arrangements is further mapped injectively to the set of array arrangements such that the set of self-assembly pattern arrangements is mapped bijectively to the set of array arrangements;
forming arrays of template structures on at least one substrate, wherein each of the arrays is arranged in accordance with an array arrangement in the set of array arrangements such that the arrays correspond surjectively onto the set of array arrangements; and
mapping a set of self-assembly pattern arrangements surjectively onto the set of array arrangements with a central processing core and based on self-assembly patterns empirically observed to have been formed by a self-assembling material as a result of the arrays.

* * * * *